United States Patent
Ohmi et al.

(10) Patent No.: US 6,242,783 B1
(45) Date of Patent: *Jun. 5, 2001

(54) SEMICONDUCTOR DEVICE WITH INSULATED GATE TRANSISTOR

(75) Inventors: Tadahiro Ohmi, Sendai; Mamoru Miyawaki, Tokyo, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/126,757

(22) Filed: Sep. 27, 1993

Related U.S. Application Data

(63) Continuation of application No. 07/896,786, filed on Jun. 9, 1992, now abandoned, which is a continuation of application No. 07/620,713, filed on Dec. 3, 1990, now abandoned.

(30) Foreign Application Priority Data

Dec. 2, 1989 (JP) .................................................. 1-314031

(51) Int. Cl.⁷ ..................................................... H01L 29/76
(52) U.S. Cl. ............................................. 257/401; 257/618
(58) Field of Search ................................ 357/23.1, 23.7, 357/22, 42, 55, 56, 68; 257/401, 618, 402, 408

(56) References Cited

U.S. PATENT DOCUMENTS

| | | | |
|---|---|---|---|
| 4,393,391 | 7/1983 | Blanchard | 357/23 |
| 4,969,023 | * 11/1990 | Svedberg | 357/23.7 |
| 4,979,014 | * 12/1990 | Hieda et al. | 257/401 |
| 4,996,574 | 2/1991 | Shirasaki | 357/23.7 |
| 5,021,843 | * 6/1991 | Ohmi | 257/401 |
| 5,331,197 | * 7/1994 | Miyawaki et al. | 257/401 |
| 5,567,962 | * 10/1996 | Miyawaki et al. | 257/296 |

FOREIGN PATENT DOCUMENTS

| | | |
|---|---|---|
| 2526586 | 11/1983 | (FR) . |
| 54-136275 | 10/1979 | (JP) . |
| 64-82672 | 3/1982 | (JP) . |
| 8603341 | 6/1986 | (WO) . |

OTHER PUBLICATIONS

The 49th Lecture Meeting of the Society of Applied Physics, a Collection of Lectures, M Shirasaki, et al., vol. 2, Autumn, 6a–B–7, p. 656, 1988, Dec. 1988.

Extended Abstracts of the 18th (1986 International) Conference on Solid State Devices and Materials, "Paramost—A New Parasitic Resistance Model for Deep Submicron MOS Transistors" 1986, K. Yano, et al., pp. 85–88, Dec. 1986.

International Electron Devices Meeting, "Characterization of the Electron Mobility in the Inverted <100> SI Surface", 1979, A.G. Sabnis et al., pp. 18–21, Dec. 1979.

International Electron Device Meeting, "High performance CMOS Surrounding Gate Transistor (SGT) for Ultra High Density LSIs" 1988, H. Takato, et al pp. 222–225, Dec. 1988.

(List continued on next page.)

Primary Examiner—Mark V. Prenty
(74) Attorney, Agent, or Firm—Fitzpatrick, Cella, Harper & Scinto

(57) ABSTRACT

An insulated gate transistor comprises source regions; drain regions; channel regions provided between the source and drain regions; a gate electrode; and gate insulative film provided between the channel regions and the gate electrode. The device has a semiconductor region which is provided so as to be in contact with the channel regions and has the same conductivity type as that of the channel region and has an impurity concentration higher than that of the channel region. The gate electrode has at least two opposite portions which face each other.

10 Claims, 17 Drawing Sheets

OTHER PUBLICATIONS

IEEE Transactions on Electron Devices, "Effects of a New Trench–Isolated Transistor Using Sidewall Gates", vol. 36, No. 9–I, Sep. 1989, K. Hieda et al., pp. 1615–1619.
International Electron Devices Meeting, Washington, D.C. "New Effects of Trench Isolated Transistor Using Side–Wall Gates", Dec. 6–9, 1987, K. Hieda et al., pp. 736–739.

International Electron Devices Meeting, "A Fully Depleted Lean–channel Transistor (DELTA)—A Novel Vertical Ultra Thin SOI MOSFET", 1989, D. Hisamoto et al., pp. 833–836, Dec. 1989.

* cited by examiner

FIG. 15A
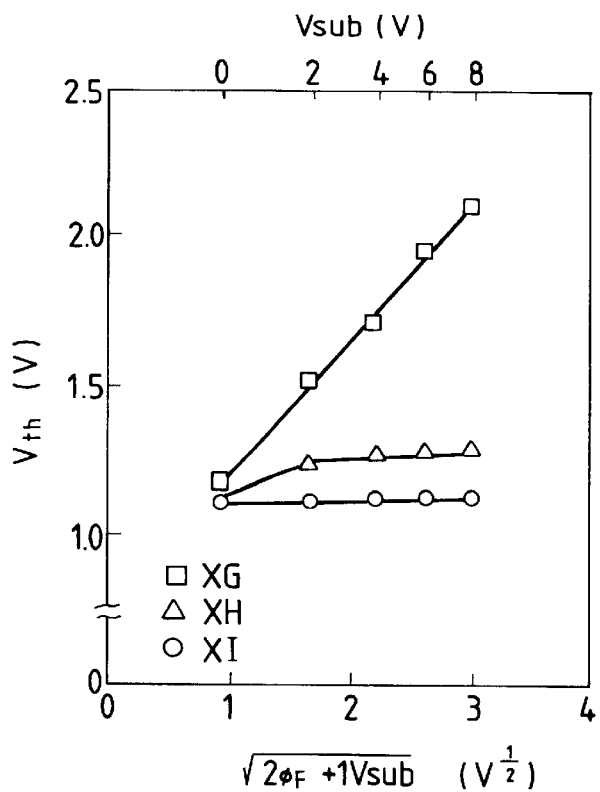
FIG. 15B
FIG. 15C
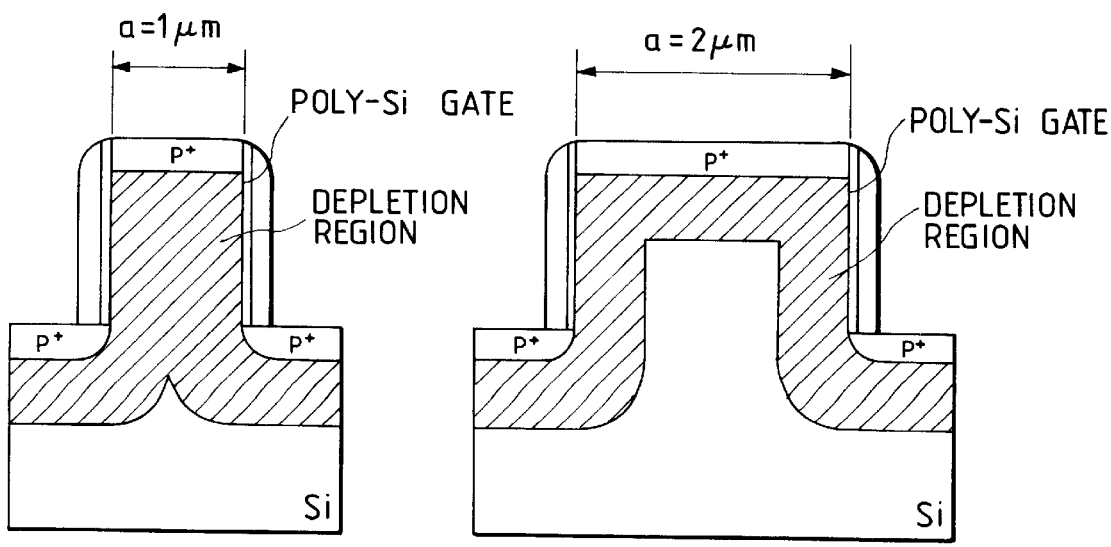

US 6,242,783 B1

SEMICONDUCTOR DEVICE WITH INSULATED GATE TRANSISTOR

This application is a continuation of application Ser. No. 07/896,786 filed on Jun. 9, 1992 and now abandoned, which is a continuation application Ser. No. 07/620,713 filed on Dec. 3, 1990 and now abandoned.

BACKGROUND OF THE INVENTION

1. Field of the Invention

The present invention relates to a semiconductor device which is used as various semiconductor integrated circuits and, more particularly, to an insulated transistor which is suitable for use as an ULSI.

2. Related Background Art

As a transistor for use in an ULSI, a transistor having a gate length of a submicron size is being developed due to the advancement of the fining processing technique.

FIG. 10 is a schematic cross sectional view showing a LDD (lightly doped drain) structure as a typical MOS type field effect transistor (hereinafter, referred to as an MOSFET). Reference numeral 201 denotes a P type semiconductor substrate; 202 a field oxide film; 203 and 204 n$^+$ layers of source and drain regions, respectively; 205 a gate insulative film; 206 a gate electrode; 207 and 208 n$^-$ layers provided to reduce the field concentration near gates of source and drain, respectively; 209 a channel doped layer provided by ion implantation in order to set a threshold value to a desired value; and 210 a p$^+$ layer.

However, the transistor with the above structure has the following problems.

First, a drain current $I_D$ and a mutual conductance (gm) are small due to the n$^-$ layers 207 and 208. Second, mobility of the carrier decreases. Third, a gate width W cannot be fined by the scaling similar to that of a gate length L.

The above problems will now be described in detail hereinbelow. FIG. 11 is a graph showing an example of the relation between the channel length and the drain current which has been disclosed in K. Yano, M. Aoki, and T. Masuhara, "Extended Abstracts of the 18th (1986 International) Conference on Solid State Devices and Materials", pages 85–88, 1986. In the above literature, the cases of drain voltages of 0.1 V and 5 V and temperatures of 77° K. and 300° K. are compared. It will be understood from FIG. 11 that a decrease in channel length and an increase in drain current are not proportional as shown by broken lines XA but are as shown by solid lines XB because of a parasitic drain resistance by the n$^-$ layers 207 and 208. XC denotes actual measured values. Since a large drain current is not derived as mentioned above, the mutual conductance characteristics (gm characteristics) deteriorate.

A scaling rule of a typical MOSFET is shown in the following Table 1.

TABLE I

| Parameter | Scaling ratio |
| --- | --- |
| Channel length | 1/K |
| Channel width | 1/K |
| Gate oxide film thickness | 1/K |
| Junction depth | 1/K |
| Depletion layer thickness | 1/K |
| Channel impurity concentration | K |
| Voltage | 1/K |

As will be understood from Table 1, to prevent a punch through current between the source and the drain in association with the realization of the fine channel length L, it is sufficient to raise the impurity concentration $N_a$ of a region serving as a channel. However, when an impurity concentration of the channel becomes high, mobility of the carrier decreases due to the impurity scattering and the gm characteristics deteriorate. Therefore, separate from the above method, in order to prevent the punch through current, there is also considered a method whereby the p$^+$ layer 210 is formed at a position near the layer of the gate insulative film 205. However, even in the case using such a method, a field strength in the vertical direction increases for the carrier moving direction and the carrier mobility decreases in accordance with a correlation as shown in FIG. 12. [FIG. 12 shows the relation between the field strength (axis of abscissa) in the vertical direction and the mobility (axis of ordinate) disclosed in A. G. Sabnis et al., "IEDM" pages 18–21, 1979. XD, XE, and XF denote actual measured values when the power source voltage is set to 0.0 V, –5.0 V, and –20.0 V, respectively.]

That is, the MOSFET whose gate length L lies within a range from 0.5 to 0.8 μm can improve the characteristics to a certain degree by the scaling rule of Table 1. However, if the gate length L is smaller, remarkable deterioration of the drain current $I_D$, gm characteristics, and the like starts. In addition, when the gate length is further made fine, a ratio of the wiring portions in the whole region further increases, so that a transistor having higher gm characteristics is demanded. However, to satisfy such a requirement, there is only a method of increasing the gate width W in the present situation. Such a method cannot accomplish the inherent object to fine.

The above-described problems similarly occur even in a GOLD (Gate Overlap Lightly doped Drain) type MOSFET which is called an improved type of the LDD type MOSFET.

Therefore, to improve the problems of the MOSFET having the foregoing construction, there is an SGT (Surrounding Gate Transistor) having a structure in which four gate electrodes are arranged so as to face one another as proposed in H. Takato, K. Sunouchi, N. Okabe, A. Nitayama, K. Hieda, F. Horiguchi, and F. Masuoka, "IEDM (International Electron Device Meeting)", pages 222–225, 1988. The structure of the SGT is shown in FIG. 13.

In FIG. 13, reference numeral 215 denotes a substrate; 216 a p well layer; 217 a source region; 218 a gate electrode; 219 a gain insulative film; 220 a drain region; and 221 a leading electrode of a drain. In the above structures, since the gate electrode 218 is formed so as to surround the channel region, there are advantages such that the field concentration is reduced, an adverse influence by a hot carrier or the like is reduced, and the potential of the channel portion can be easily controlled by the gate, and the like.

In addition to the above structure, there has also been proposed an SOI type MOSFET structure such that an Si mesa structure is formed on an SiO$_2$ layer on an Si substrate and a gate oxide film is formed on the mesa side wall (refer to Masahiro Shirasaki, Junichi Iizuka, Takashi Iwai, Seiichiro Kawamura, Nobuo Sasaki, and Motoo Nakano, "The 49th Lecture Meeting of the Society of Applied Physics, A Collection of Lectures", Vol. 2, Autumn, 6a-B-7, page 656, 1988.)

As results of that an examination was carefully performed and many experiments were repetitively executed with respect to each of the conventional examples which have been described in detail above, it has been found that the OFF characteristics of the transistor are deficient and the operation is unstable in spite of the above structure.

It is believed the above-noted problems occur because all of the Si regions in which the channels are formed are covered by an $SiO_2$ insulative film except the interface between the source and drain regions. That is, the Si region is in a complete floating state and its potential cannot be fixed and the operation becomes unstable. Further, for a period of time of the ON state of the transistor, at a moment when the transistor is turned off, the minority carriers (for instance, electrons in the case of the p type MOSFET) generated in the Si region cannot escape to any location but remain until they are recombined and extinguished in the Si region, so that the OFF characteristics deteriorate.

SUMMARY OF THE INVENTION

In order to solve the above technical problems, it is an object of the invention to provide a semiconductor device in which low electric power consumption and high operating speed are accomplished by a construction which is suitable to fine work.

To accomplish the above object, according to the invention, there is provided a semiconductor device comprising source regions, drain regions, channel regions provided between the source and drain regions and gate electrodes provided for the channel regions through gate insulative films. A semiconductor region having the same conductivity type as that of the channel region and an impurity concentration higher than that of the channel region is provided so as to be in contact with the channel region. The gate electrode has at least two opposite portions which face each other and is arranged so that the opposite portions have surfaces which intersect the junction surface between the channel region and the semiconductor region.

Therefore, since a field strength in the vertical direction for the carrier moving direction is small due to the two opposite gate electrodes, the semiconductor device of high mobility and high gm characteristics is obtained, the generation of the hot carrier can be prevented by the field relaxation, and the life and reliability of the device are improved.

Since the electrostatic capacitance of the Si portion under the gate oxide film decreases, the S factor (Subthreshold swing) characteristics are improved and leak current is extremely small.

On the other hand, the area which is occupied by the device decreases and a high integration can be realized.

Further, according to the invention, a region having a conductivity type different from the conductivity type of the source and drain portions and an impurity concentration higher than that of the channel region is provided in the portions other than the portions in which the two opposite gate electrodes are formed in the channel region. Such a high impurity concentration is set to a value that is not inverted by a driving voltage which is applied to the gate when the transistor is driven. Thus, when the transistor is turned on or off, injecting/outgoing speeds of the minority carriers (holes in the case of the N channel MOS transistor; electrons in the case of the P channel MOS transistor) into/from the semiconductor layer surrounded by the two opposite gate electrodes are increased, so that the switching characteristics are improved.

On the other hand, in the case where a fine pattern of the level of 1 μm was accomplished, the device must also cope with operation at the low temperature level of liquid nitrogen. However, even if such a low-temperature operation was executed and the carriers were stopped, the increase in parasitic resistance and the of decrease in drain current are extremely small as compared with those in the conventions device.

BRIEF DESCRIPTION OF THE DRAWINGS

FIGS. 5A–5C, 5D1–5D-2 and 5E are diagrammatic cross sectional views for explaining a method of manufacturing a semiconductor device according to the first embodiment of the invention;

FIGS. 15A to 15C are a graph and cross sectional views explaining the operation of the SGT of FIG. 13.

DETAILED DESCRIPTION OF THE PREFERRED EMBODIMENTS

Figure 1A:
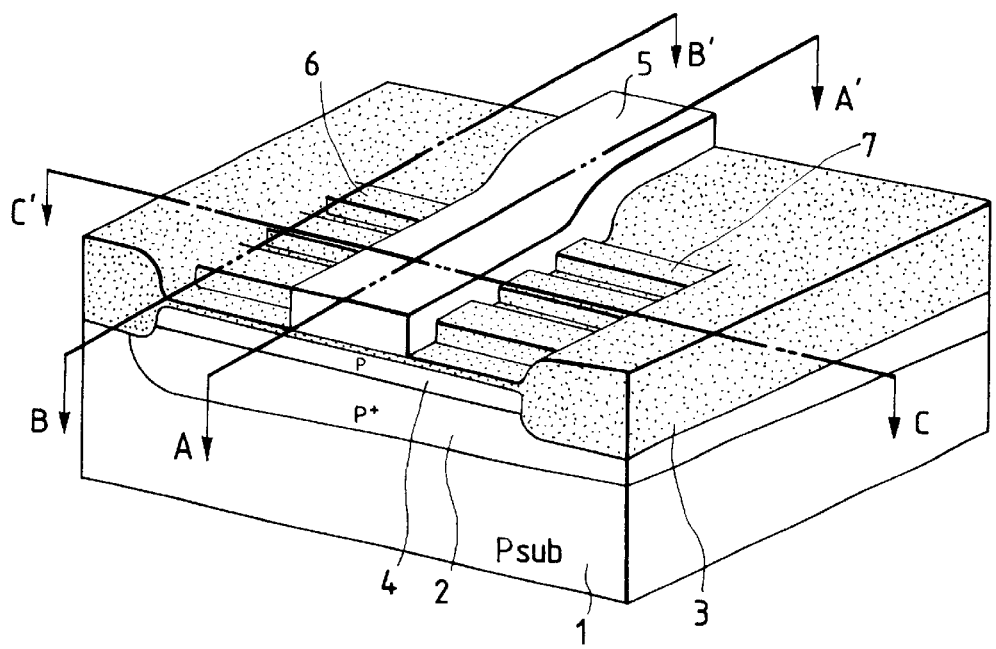
FIG. 1A is a diagrammatic perspective view showing an n type MOSFET according to the first embodiment of the invention.

The invention relates to a semiconductor device which is constructed by a compound semiconductor such as Si, Ge, GaAs, or the like and is characterized by a peripheral construction which surrounds a channel region.

Embodiments of the present invention will be described as follows. It should be noted that the present invention should not be limited to the embodiments and that any modifications for achieving the object of the present invention can be made by those skilled in the art without deviating from a spirit of the present invention.

In other words, a preferred embodiment of the invention relates to a semiconductor device in which a gate electrode has at least opposite portions which sandwich the channel region and a part of the other portions excluding the junction portion between the source and drain regions in the channel region is formed so as to be in contact with a doped region which can give and receive minority carriers to/from the channel region.

On the other hand, it is sufficient that the doped region is formed as a semiconductor region having a conductivity type different from the conductivity type of the source and drain regions and an impurity concentration higher than that of the channel region. The kind and the conductivity type of the impurities are not limited. Practically speaking, an impurity concentration of the doped region is desirably set to a value such as not to invert the doped region by a driving voltage which is applied to the gate when the transistor is driven, while functionally, it is sufficient to use a construction such that the minority carriers from the channel region sandwiched by the opposite portions of the gate electrode can be received.

As a material which is used as a gate electrode of the invention, metal, polycrystalline silicon, silicide, polycide, etc. can be used. Practically speaking, it is possible to use Al, W, Mo, Ni, Co, Rh, Pt, or Pd itself, or a silicide or polycide thereof. A proper material is selected from those materials in consideration of a structure, driving condition, and the like of the MOSFET and its work function.

On the other hand, as shapes of the gate electrode and the doped region, a structure in which no gate electrode is formed in the portion which faces the dope region, a structure in which the same doped region is formed in the portion which faces the doped region, a structure in which a part of the gate electrode is also arranged in the portion which faces the dope region as in an embodiment, or another structure, which will be explained hereinlater may be used. Further, it is preferred that the cross sectional shape of the channel region when it is cut in the direction perpendicular to the carrier moving direction is square such as a quadrangle or the like in a manner such that three surfaces of the channel region are surrounded by the gate electrode and the remaining portion is in contact with the doped region. Each side of the cross section of the channel region is not necessarily set to an accurate straight line but may be set to a curve with a certain curvature. Each edge portion in the case of the curved shape may be chamfered in consideration of a covering performance of the gate insulative film.

As a preferred embodiment of the invention, as shown in each embodiment, which will be explained hereinlater, it is desirable to use a structure such that an MOSFET element is laterally arranged on the substrate and is in contact with the doped region on the substrate side and is arranged such that the opposite portions of the gate electrode have the surfaces which intersect the substrate surface. In addition to the above structure, it is also possible to use a structure such that the opposite portions of the gate electrode are arranged substantially in parallel with the substrate surface and the doped region is formed on the side surface. However, when considering the present manufacturing processes, it is preferable to use the former structure, that is, constructions according to the first to fourth embodiments which will be explained hereinlater.

First Embodiment

The first embodiment according to the invention will now be described in detail with reference to FIG. 1.

Figure 1B:
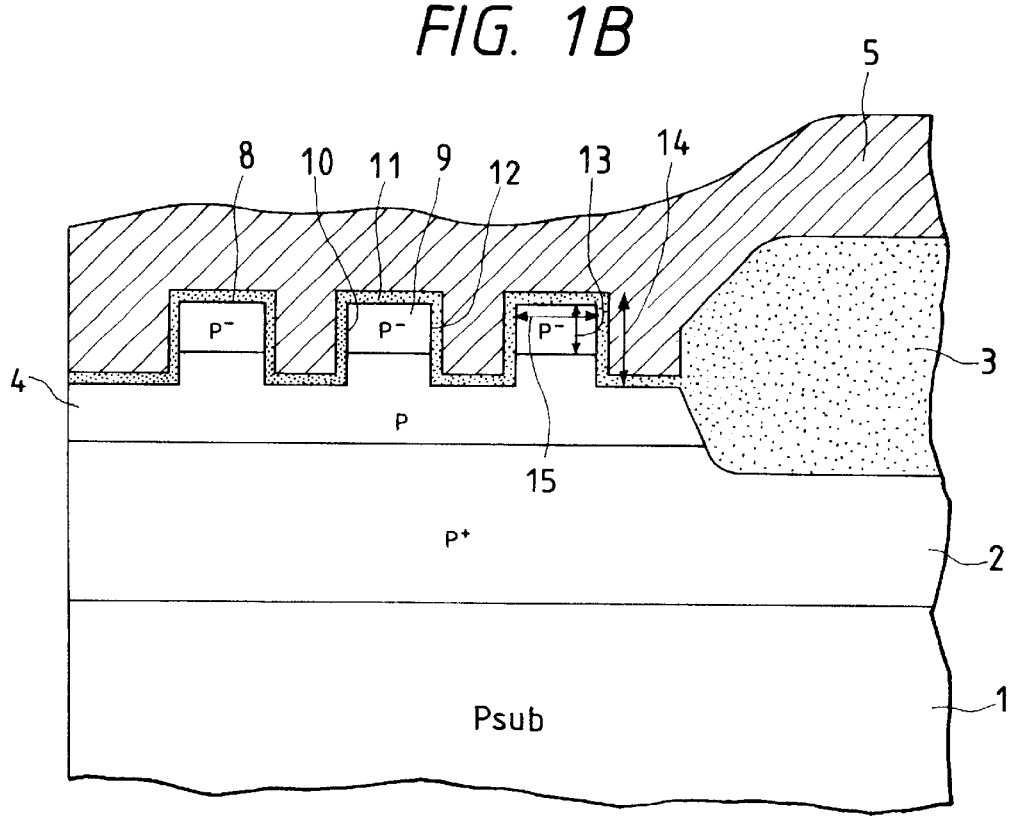
FIG. 1B is a diagrammatic cross sectional view taken along the line AA' in FIG. 1A.
Figure 1C:
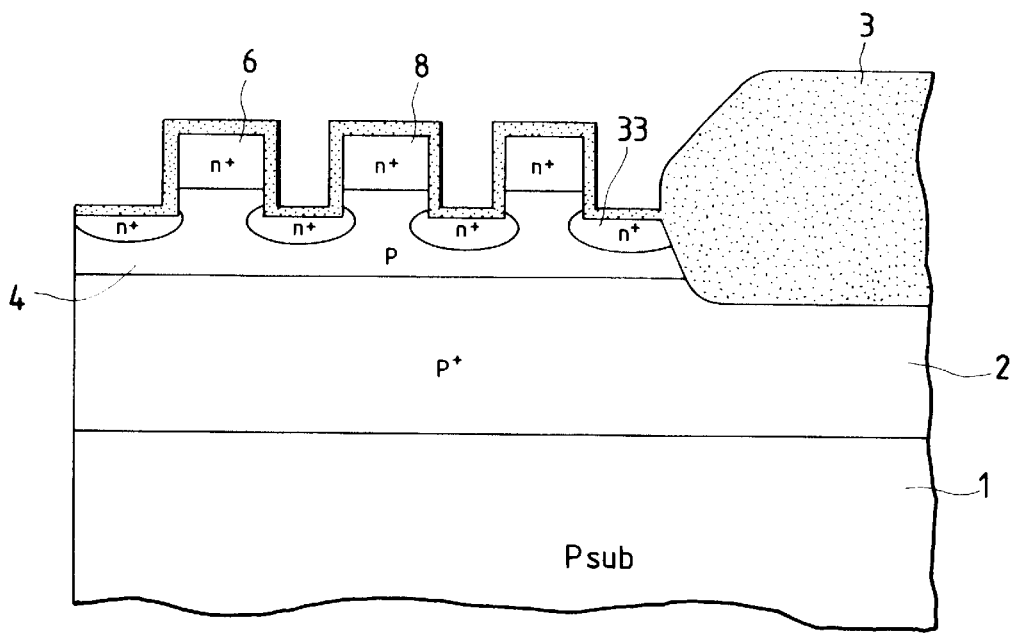
FIG. 1C is a diagrammatic cross sectional view taken along the line BB' in FIG. 1A.
Figure 1D:
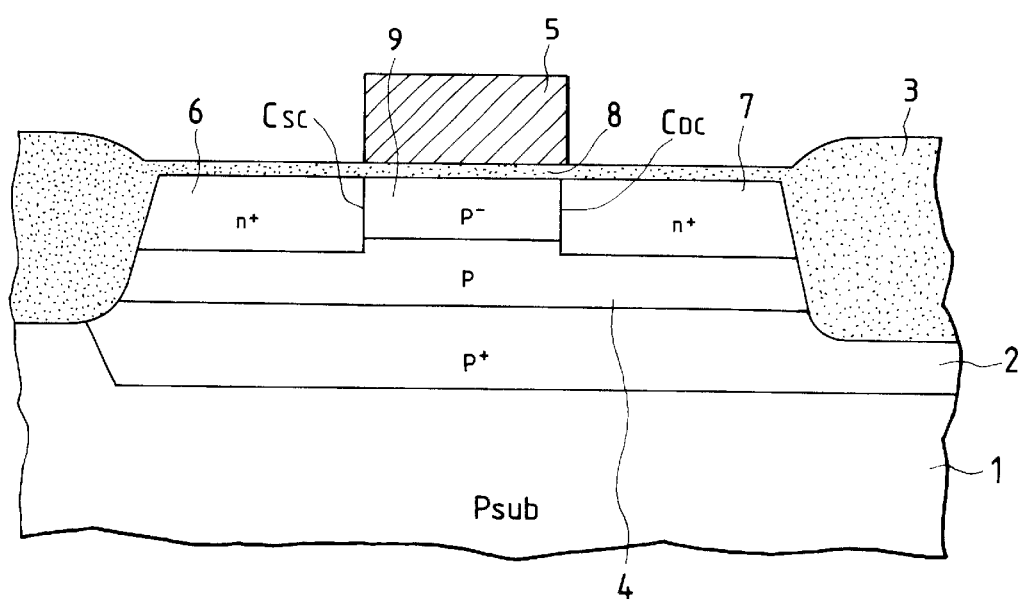
FIG. 1D is a diagrammatic cross sectional view taken along the line CC' in FIG. 1A.

FIG. 1A is a diagrammatical perspective view showing an n type MOSFET according to the embodiment and illustrates a single MOSFET in which three MOSFET elements according to the present invention are arranged substantially in parallel and constructed in an electrically parallel relationship. Reference numeral 1 denotes a substrate made of a p type semiconductor of Si; 2 indicates a $p^+$ buried layer which is made of p type Si and has an impurity concentration higher than that of the p type substrate and which is maintained at a reference potential such as an earth in operation; 3 a field oxide film made of silicon oxide; 4 a p type well layer serving as a doped region; 5 a gate electrode made of polycrystalline Si into which P ions were doped; and 6 and 7 a source region and a drain region which are made of an $n^+$ type semiconductor. FIG. 1B shows a cross sectional view taken along the line AA', FIG. 1C shows a cross sectional view taken along the line BB', and FIG. 1D shows a cross sectional view taken along the line CC'. In the diagrams, the same parts and components are designated by the same reference numerals.

FIG. 1B is a cross sectional view of the gate electrode portion and shows the surface perpendicular to the moving direction of the carrier. A cross sectional construction of a plurality of channel regions is shown. An impurity concentration of a channel region 9 is set to be lower than that of the well layer 4. Reference numeral 8 denotes a gate insulative film made of silicon oxide.

FIG. 1C is a cross sectional view of a source region portion and shows the surface perpendicular to the moving direction of the carrier in the channel region and illustrates a cross sectional construction of a plurality of source regions.

FIG. 1D is a cross sectional view of one MOSFET element portion and shows the surface taken along the moving direction of the carrier in the channel region and illustrates a junction portion $C_{SC}$ between the source and channel regions and a junction portion $C_{DC}$ between the drain and channel regions. Reference numeral 33 shown in FIG. 1C denotes an n⁺ region formed in the p type well layer 4 at a position under the groove.

Figure 5A:
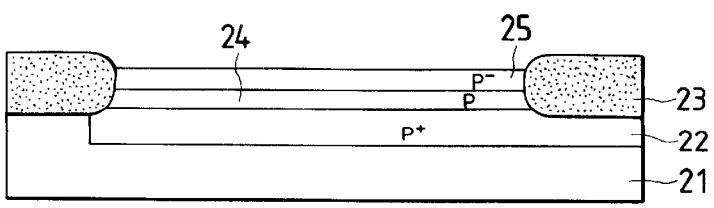
Figure 5B:
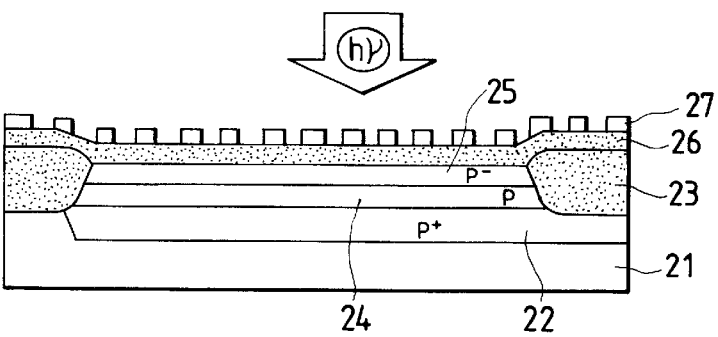
Figure 5C:
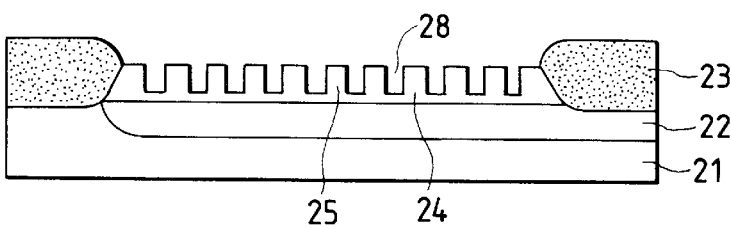
Figures 1, 5D:
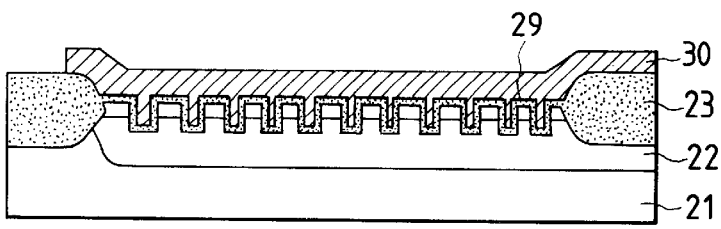
Figures 2, 5D:
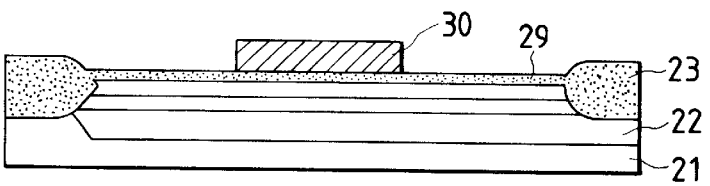

Although structures of the source and drain electrodes are not shown in FIG. 1 for simplicity of the drawings, the source and drain electrodes can be formed by forming a silicon oxide film onto the surface of the structure by a CVD apparatus and by opening contact holes in a manner similar to the ordinary MOSFET. Such an electrode structure can also be easily formed.

The operation principle of the MOSFET according to the invention will now be described. For convenience of explanation, one of a plurality of MOSFET element portions shown in FIG. 1A will now be described. An impurity concentration of the semiconductor layer of the channel region is set to a small value such as about $1 \times 10^{14}$ to $1 \times 10^{15}$ cm⁻³. A gate voltage $V_G$ is increased by applying a voltage to the gate electrode by voltage applying means (not shown). When the gate voltage $V_G$ is equal to or higher than a threshold voltage $V_{th}$, in FIG. 1B, inversion layers are formed in the channel region from three side directions of left side surface 10, upper surface 11 and a right side surface 12 of the gate, and the transistor is turned on. Electrons as carriers in the above case are moved and propagated in the direction perpendicular to the surface of the drawing of FIG. 1B. The surfaces 10 and 12 face each other. When the gate voltage is raised, the potential is increased from both sides. Therefore, when the gate voltage is equal to or less than the threshold voltage $V_{th}$, the potential of the p⁻ layer 9 simultaneously increases and the field concentration is reduced. On the other hand, although the upper surface 11 does not face the other portion of the gate electrode, the same threshold value can be set by setting a depth $d_1$ of the p⁻ layer 13 to a desired value. On the other hand, the thickness $d_1$ and a depth $d_2$ of a groove 14 in the structure of the invention are set so as to satisfy the following relation.

$$d_1 < d_2 \tag{3}$$

On the other hand, assuming that the number of MOSFET elements, that is, the number of p⁻ layers is set to N and a lateral width of a p⁻ layer 15 is set to $d_3$, the channel width W is given by $$W = N \times (2d_1 + d_3) \tag{4}$$

As will be understood from the equation (3), in the construction of the embodiment, although the gate electrode has the opposite portions, the channel width W is determined independently of the depth $d_2$ of the groove. Therefore, a variation of the channel width W is extremely small even when a plurality of transistors are manufactured.

Further, when the gate voltage exceeds the threshold value and the transistor is turned on, electrons are implanted into the p⁻ layer 9 and holes are supplied from the p well layer 4.

In the conventional MOSFET, at a moment when the transistor is turned off from the ON state, there is no path through which the holes existing in the p⁻ layer in the ON state escape and the OFF characteristics are deficient. However, according to the embodiment, when the transistor is turned off, since the holes are moved to the side of the p layer 4, high-speed OFF characteristics can be realized.

Figure 2:
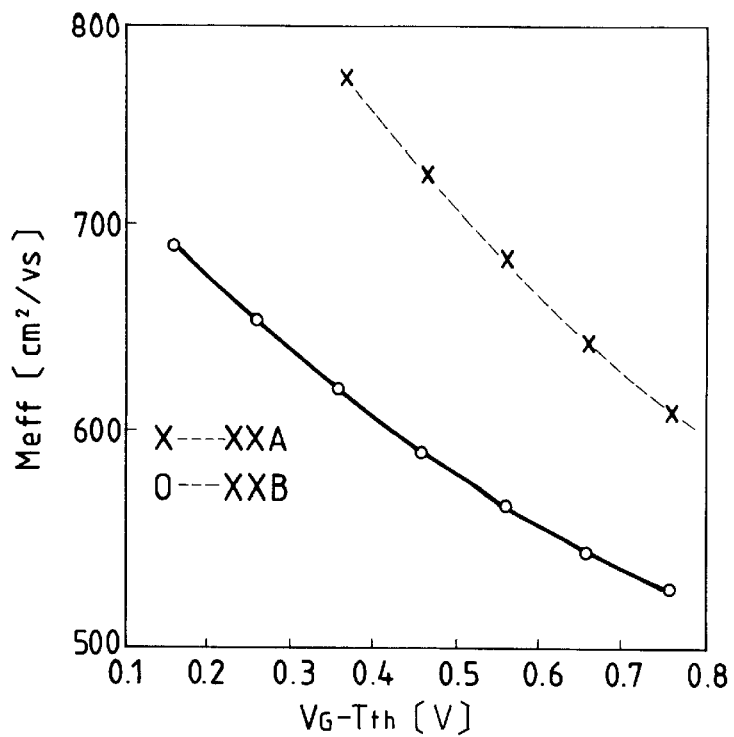
FIG. 2 is a graph showing the relation between the effective field strength $E_{eff}$ of the channel forming portion and the mobility according to the invention.
Figure 12:
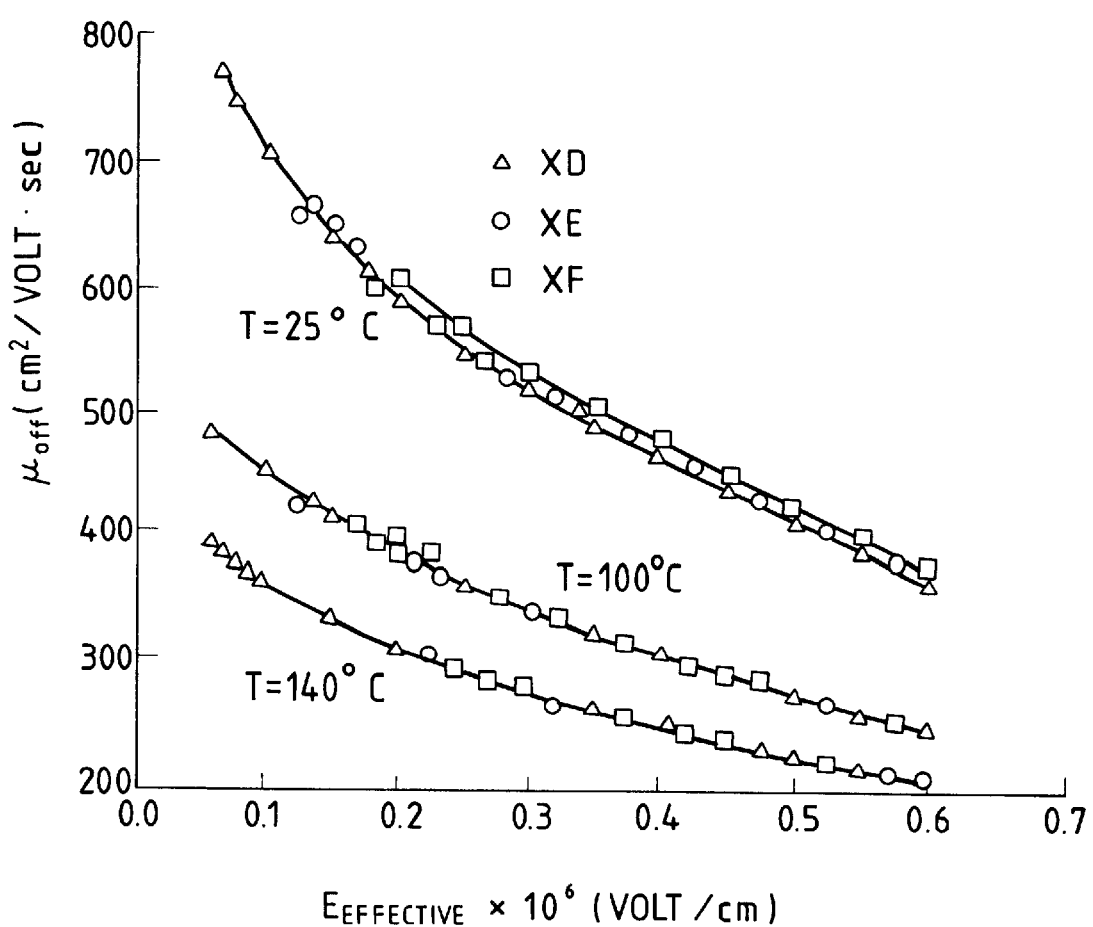
FIG. 12 is a graph showing the relation between the field strength in the vertical direction of the MOSFET having the conventional LDD structure and mobility.

The result of the analysis of the transistor according to the embodiment will be described with reference to FIGS. 2 to 4. In FIG. 2, an effective field strength $E_{eff}$ of the channel forming portion is obtained for each gate voltage and a mobility is calculated from the relation between the $E_{eff}$ and the mobility as shown in FIG. 12 (A. G. Sabnis et al., "IEDM" pages 18 to 21, 1979).

Figure 3:
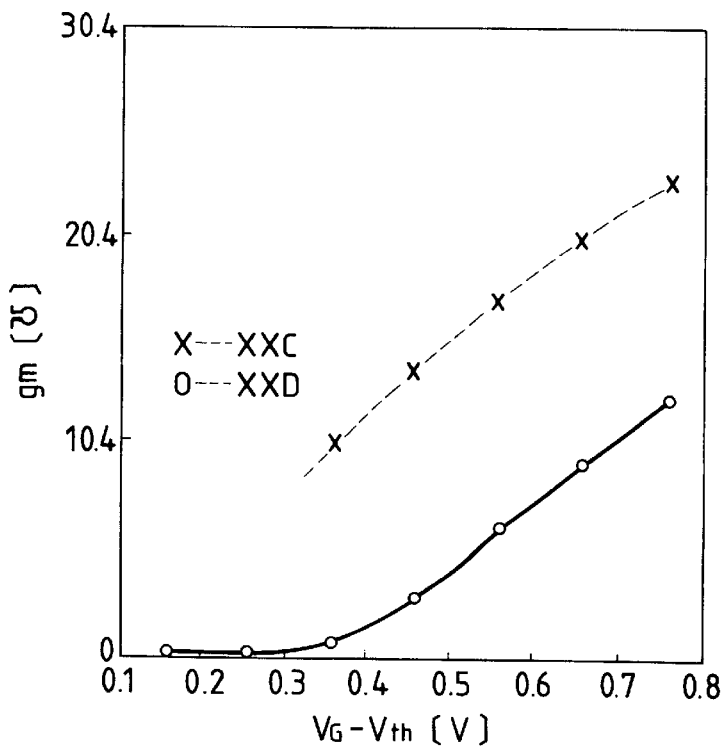
FIG. 3 is a graph showing the relation between the effective field strength $E_{eff}$ of the channel forming portion and the gm characteristics according to the invention.
Figure 4A:
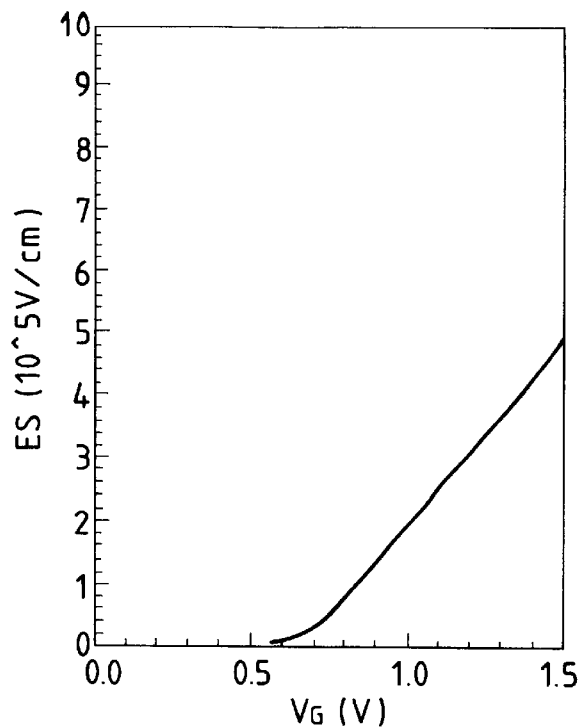
FIG. 4A is a graph showing the dependence characteristics of the field strength $(E_s)$ to the gate voltage $(V_G)$ when a lateral width $d_3$ of a $p^-$ layer 4 is set to 100 Å.
Figure 4B:
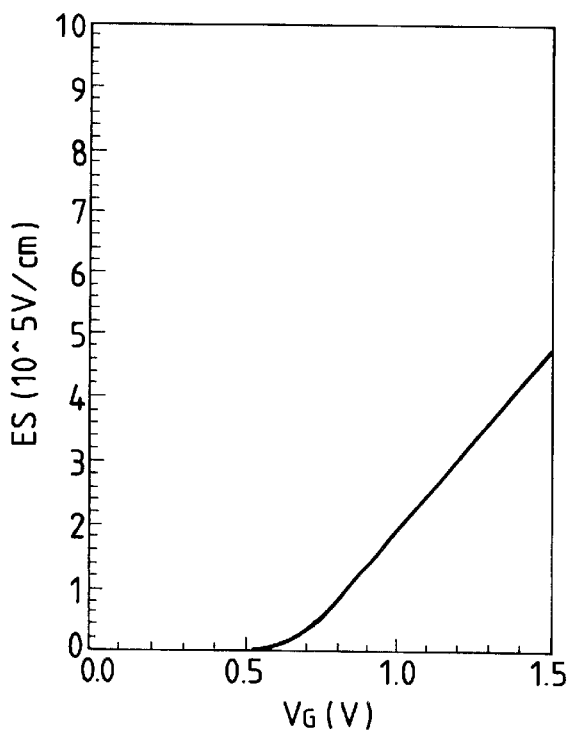
FIG. 4B is a graph showing the dependence characteristics of the field strength $(E_s)$ to the gate voltage $(V_G)$ when the lateral width $D_3$ of the $p^-$ layer 4 is set to 500 Å.
Figure 4C:
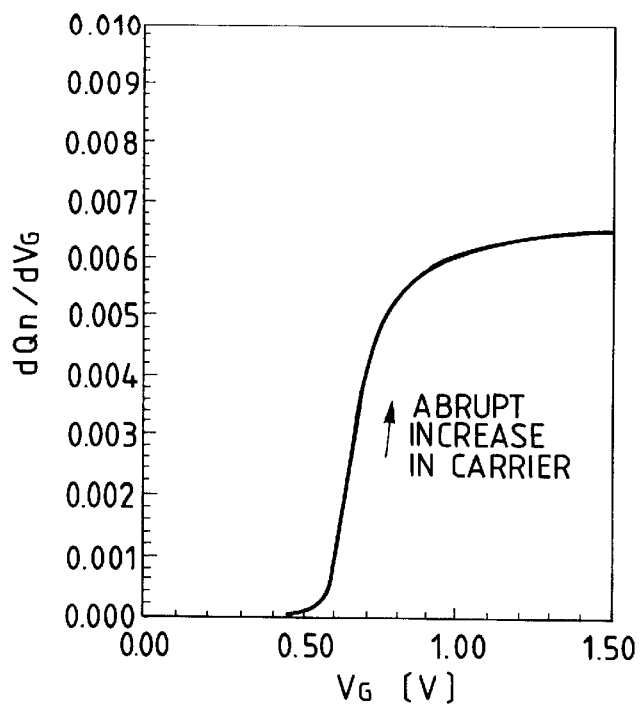
FIG. 4C is a graph showing the dependence characteristics of the carrier increasing tendency to the gate voltage $(V_G)$ when the lateral width $d_3$ of the $p^-$ layer 4 is set to 100 Å.
Figure 4D:
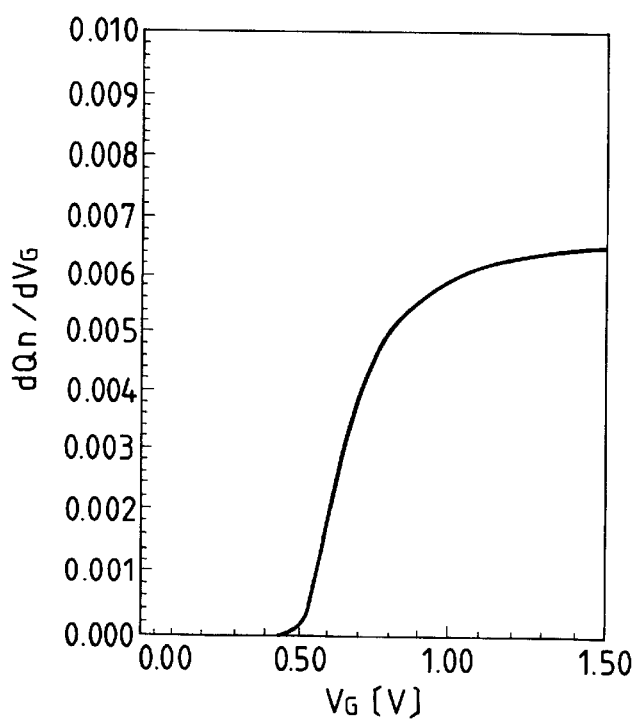
FIG. 4D is a graph showing the dependence of the carrier increase with to the gate voltage $(V_G)$ when the lateral width $d_3$ of the $p^-$ layer 4 is set to 500 Å.

As will be understood from FIG. 12, improved characteristics are obtained. For example, a mobility $\mu_{eff}$ (XXA) of the transistor having a structure of two opposite gate electrodes is larger than that (XXB) of the type of the single gate electrode.

$$E_{eff} = \frac{1}{\varepsilon_{Si}} \left( Q_B + \frac{1}{2} Q_N \right) \tag{5}$$

was used to calculate the above effective field strength $E_{eff}$, where, $Q_B$: amount of charges in the depletion layer $Q_N$: amount of charges in the inversion layer $\varepsilon_{Si}$: dielectric constant of the Si semiconductor FIG. 3 shows the result of the mutual conductance gm which calculated from the effective mobilty $\mu_{eff}$ and the amount of charge. As will be understood from FIG. 3, the value of gm is also large reflecting the large mobility. In this case as well, the value of gm of the type (XXC) of the opposite gate electrodes is larger than that of the type (XXD) of the single gate type.

FIGS. 4A to 4D are graphs showing the characteristics of a field strength $E_S$ to the lateral width $d_3$ of the p⁻ layer 4 and the characteristics of the carrier increasing tendency to the gate voltage. The values of $d_3$ are shown in the cases of 100 Å and 500 Å. As will be understood from FIGS. 4A and 4B, even if the lateral width $d_3$ is reduced, the electric field $E_S$ applied to the channel forming portion does not change and the problems of a decrease in gm and the like do not occur. On the other hand, as will be understood from FIGS. 4C and 4D, there is an advantage that as the lateral width $d_3$ decreases, the carriers suddenly increase after the inversion layer is formed. When the lateral width $d_3$ is reduced, the punch through between the source and drain can also be prevented and there is obtained a point which can be realized in the low concentration p⁻ layer.

Further, as a result of the subthreshold swing characteristics, in the case where the lateral width $d_3$ is sufficiently narrow and the depletion layer is extended over the whole surface between the opposite electrodes, a limit value of about 60 mV/decade was obtained. This is because the capacitance on the substrate side is so small that it can be ignored compared to a capacitance $C_G$ of a gate insulative film $C_S$.

$$\begin{aligned} S &= \frac{kT}{q} \ln 10 \left( 1 + \frac{C_S}{C_G} \right) \\ &\geq \frac{kT}{q} \ln 10 \\ &= 59.4 \text{ mV/decade} \end{aligned} \tag{6}$$

In the above structure, the channel width is given by the equation (3). To obtain the same channel width in the ordinary MOSFET structure, it will be understood that one circuit cell can be constructed with an occupied area smaller than that in the conventional MOSFET if the film thickness $d_1$ of the p⁻ layer is set to be equal to or larger than ½ of the lateral width $d_3$ of the p⁻ layer by setting such that $$W_{normal} = 2Nd_3 \quad (7)$$

that is, as shown by the equation (8).

$$d_1 > d_3/2 \quad (8)$$

According to the embodiment, it has been confirmed, as the result of experiments, that the excellent transistor characteristics described in detail above were obtained.

Figure 5E:
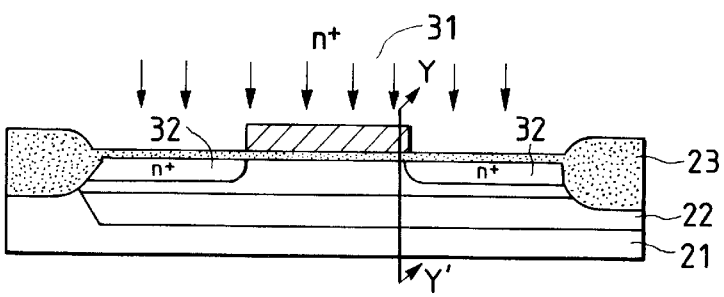

A method of manufacturing the semiconductor device according to the first embodiment will now be described with reference to FIG. 5. FIGS. 5A to 5D1 are cross sectional views when they are seen from the same direction as that of FIG. 1B. FIGS. 5D2 and 5E are cross sectional views when they are seen from the same direction as that of FIG. 1D.

As shown in FIG. 5A, ions which exhibit the p⁺ type conductivity are implanted into the surface of a p type semiconductor substrate 21 and a buried layer 22 is formed. After that, a p layer 24 and a p⁻ layer 25 are formed by an epitaxial growing method. When the buried layer 22 is formed, an epitaxial growth temperature is set to a value as low as possible, thereby preventing that the impurities from coming up to the p⁻ layer. After completion of the epitaxial growth, a field oxide film 23 to separate the devices is formed.

Then, as shown in FIG. 5B, an $SiO_2$ layer 26 serving as a mask for etching Si is formed by a thermal oxidation and a resist is coated. After that, the wafer is put into an ArF excimer laser 2-light flux interference exposing apparatus. An interference fringe pattern is set into the Si (100) direction and the wafer is exposed. Thus, as shown at 27 in FIG. 5B, a fine resist patterning whose line and space widths lie within a range from about 500 Å to 700 Å is realized. The $SiO_2$ layer 26 formed under the resist pattern 27 is patterned using the resist mask by an RIE (reactive ion etching) method until the Si surface of the p⁻ layer 25 is exposed.

As shown in FIG. 5C, the p⁻ layer 25 is etched by using the patterned $SiO_2$ layer as a mask. In this case, to prevent impurities from being mixed onto the Si wafer from the RIE apparatus, the ionizing compound polishing SUS316L surface of the inner wall of the RIE apparatus is subjected to an $F_2$ passive state forming process. Further, to prevent damage of the Si surface, an apparatus constructed so that a bias on the wafer side can be controlled to reduce a plasma ion energy is used. $SiCl_4$ is used as a reactive gas. However, the invention is not so limited $CCl_4$, $Cl_2$, or the like can be also used.

The etching is finished at the stage of formation of the p layer 24 as shown in a groove 28 in FIG. 5C. After completion of the etching, the cleaning before the gate insulative film is executed. A gate insulative film having a thickness of about 50 Å is formed as shown at reference numeral 29 by a dry oxidation.

Then, a gate electrode 30 is formed by patterning. p⁺ polycrystalline Si may be used as a gate electrode. FIGS. 5D1 and 5D2 show the same manufacturing stages except that the cutting direction differs.

Further, as shown in FIG. 5E, to form a source-drain region 32 in a manner similar to the ordinary MOSFET, As ions 31 are implanted and an annealing process is executed. Thus, the source-drain region 32 is formed. In this case, as shown in FIG. 6 (cross sectional view taken along the line YY' in FIG. 5E), there is the following relation (9) among the epitaxial thickness $d_1$ of the p⁻ layer 9, an epitaxial thickness $d_4$ of the p layer 4, and a diffusion depth $X_{jn}$ of the source-drain region 32.

$$d_1 \leq X_{jn} < d_4 \quad (9)$$

Figure 6:
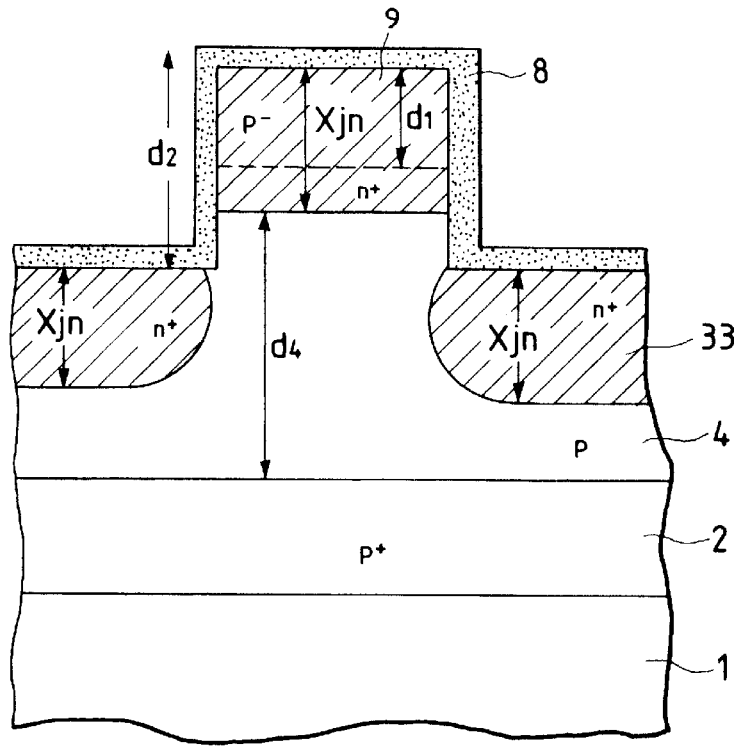
FIG. 6 is a diagrammatic cross sectional view showing a portion near the junction surface between the channel region and the drain region taken along the line YY' in FIG. 5E.

By setting those values so as to satisfy the relation of the equation (9), the source and drain regions are connected to the channel region formed in the side wall portion and the n⁺ layer 33 in FIG. 6 is separated from the p⁺ buried layer, so that the problem of the withstanding voltage decreases is solved.

After the source and drain regions are formed, the wafer surface is cleaned and is again oxidized, thereby assuring sufficient insulation among the gate, source, and drain.

After that, a silicon oxide film is formed and contact holes are formed in the source-drain region by the CVD method. Al electrodes serving as source-drain electrodes and Al wirings are formed by a sputtering method. The silicon oxide film can be also formed by the sputtering method.

As described above, the structure of the embodiment can be easily realized by a fine Si patterning technique (resist patterning, dry etching of Si).

Upon manufacturing of the device of the invention, the resist patterning doesn't need a mask matching process or the like and the number of restricting conditions which are required for the lithography is small. On the other hand, although the interference of two light fluxes has been used in the embodiment, the invention is not limited to such a method. It is also possible to use an X-ray stepper, an electron beam direct drawing apparatus, or a convergent ion beam direct drawing apparatus. As a mask for etching the p⁻ layer, it is possible to use a mask made of $Si_3N_4$ or the like which can obtain a selection ratio with Si.

As described above, although the first embodiment of the invention has been described with respect to the n type MOSFET, the invention can be also accomplished by similar processes with respect to a p type MOSFET. It is also possible to form a CMOS circuit by forming the n type MOSFET with the foregoing structure and a p type MOSFET and by electrically connecting them.

According to the embodiment, the impurity concentration in the doped region is set to a value such that the doped region is not inverted by the driving voltage which is applied to the gate electrode when the transistor is driven. That is, the impurity concentration in the doped region is determined on the basis of the impurity concentration of the channel region, component material of the gate electrode, thickness of gate insulative film, gate voltage, and the like. Therefore, other modifications of the construction based on the first embodiment were formed as experiment examples 1-1 and 1-2 and their characteristics were measured.

Experimental Example 1-1

In the experiment example 1-1, a plurality of samples of the MOSFET of the first embodiment as shown in the following table 2 were formed by the manufacturing processes shown in FIG. 5.

The samples were formed under the same conditions such that the gate electrode was made of tungsten silicide, a gate oxide film thickness was set to 50 Å, an interface level density was set to $10^{10}$ cm⁻² and an impurity concentration of the p layer 4 was set to $10^{17}$ cm⁻³. On the other hand, an impurity concentration (aa) of the p⁻ layer 9 and an interval ($d_3$) between the opposite portions of the gate electrode were changed. $\phi_{ms}$ denotes a work function difference between the gate electrode corresponding to each sample and the semiconductor. $\phi_m$ denotes a work function of the gate electrode corresponding to each sample.

A threshold value was set to 0.2 V and a power source voltage $V_{DD}$ was set to 0.6 V and the transistors were driven. Thus, the MOSFETs of the invention were remarkably excellent as compared with the conventional examples.

TABLE 2

| aa | $d_3$ | $\phi_{ms}$ | $\phi_m$ |
|---|---|---|---|
| $10^{14}$ | 2000 | −0.328 | 4.51 |
| $10^{14}$ | 1000 | −0.343 | 4.50 |
| $10^{14}$ | 500 | −0.359 | 4.48 |
| $10^{14}$ | 250 | −0.376 | 4.46 |
| $10^{14}$ | 100 | −0.399 | 4.44 |
| $10^{16}$ | 2000 | −0.506 | 4.45 |
| $10^{16}$ | 1000 | −0.485 | 4.47 |

Although tungsten slicide ($WSi_2$) has been used as a material of the gate electrode here, it is also possible to directly use $MoSi_2$, $NiSi$, $CoSi_2$, $RhSi$, etc. whose work function lies within a range from 4.43 to 4.55.

Experiment Example 1-2

A plurality of samples of the MOSFET of the first embodiment as shown in the following Table 3 were formed by the manufacturing processes of FIG. 5.

The samples were formed under the same conditions such that the gate electrode was made of platinum silicide, a gate oxide film thickness was set to 50 Å, an interface level density was set to $10^{10}$ cm$^{-2}$, and an impurity concentration of the p layer 4 was set to $10^{18}$ cm$^{-3}$. On the other hand, an impurity concentration (aa) of the p⁻ layer 9 and and an interval ($d_3$) between the opposite portions of the gate electrode were changed. $\phi_{ms}$ denotes the work function difference between the gate electrode corresponding to each sample and the semiconductor. $\phi_m$ denotes the work function of the gate electrode corresponding to each sample.

The threshold value was set to 0.35 V and the power source voltage $V_{DD}$ was set to 0.8 V and the transistors were driven. Thus, the MOSFETs of the invention were remarkably excellent as compared with the conventional examples.

TABLE 3

| aa | $d_3$ | φ ms | φ m |
|---|---|---|---|
| $10^{14}$ | 2000 | −0.178 | 4.66 |
| $10^{14}$ | 1000 | −0.193 | 4.65 |
| $10^{14}$ | 500 | −0.209 | 4.63 |
| $10^{14}$ | 250 | −0.226 | 4.61 |
| $10^{14}$ | 100 | −0.249 | 4.59 |
| $10^{16}$ | 2000 | −0.356 | 4.60 |
| $10^{16}$ | 1000 | −0.335 | 4.62 |

Although platinum silicide (PtSi) has been used as a gate electrode material here, it is also possible to directly use $Pd_2di$, $Pt_2si$, etc. whose work function is set to about 4.6.

Second Embodiment

The second embodiment of the invention will now be described with reference to FIG. 7. In FIG. 7, the same parts and components as those shown in FIG. 1 are designated by the same reference numerals and their descriptions are omitted here.

Figure 7A:
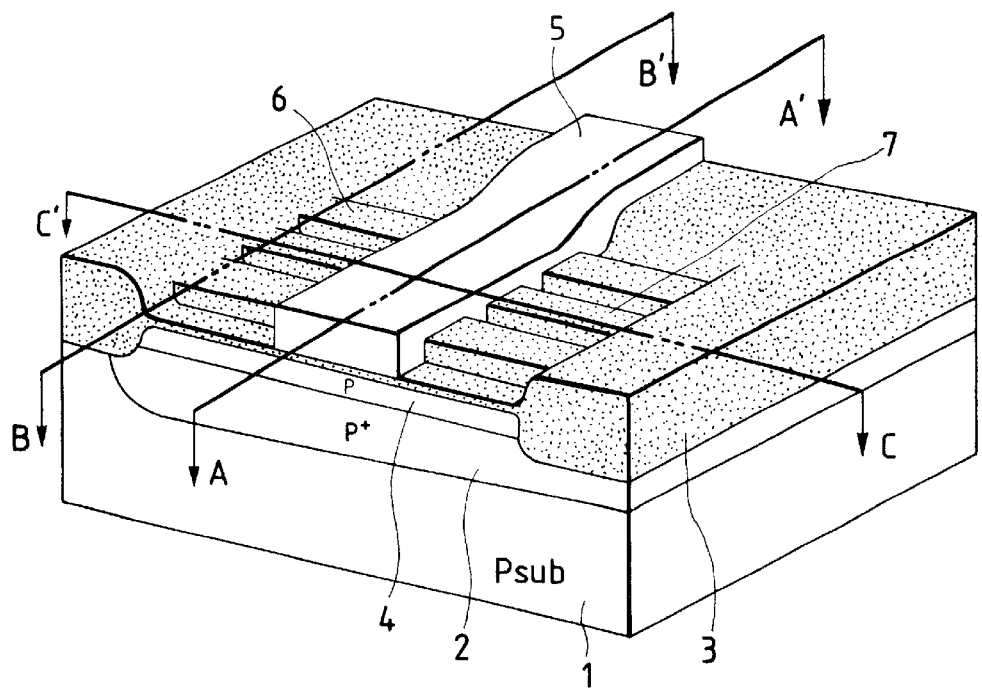
FIG. 7A is a diagrammatic perspective view showing an n type MOSFET according to the second embodiment of the invention.
Figure 7B:
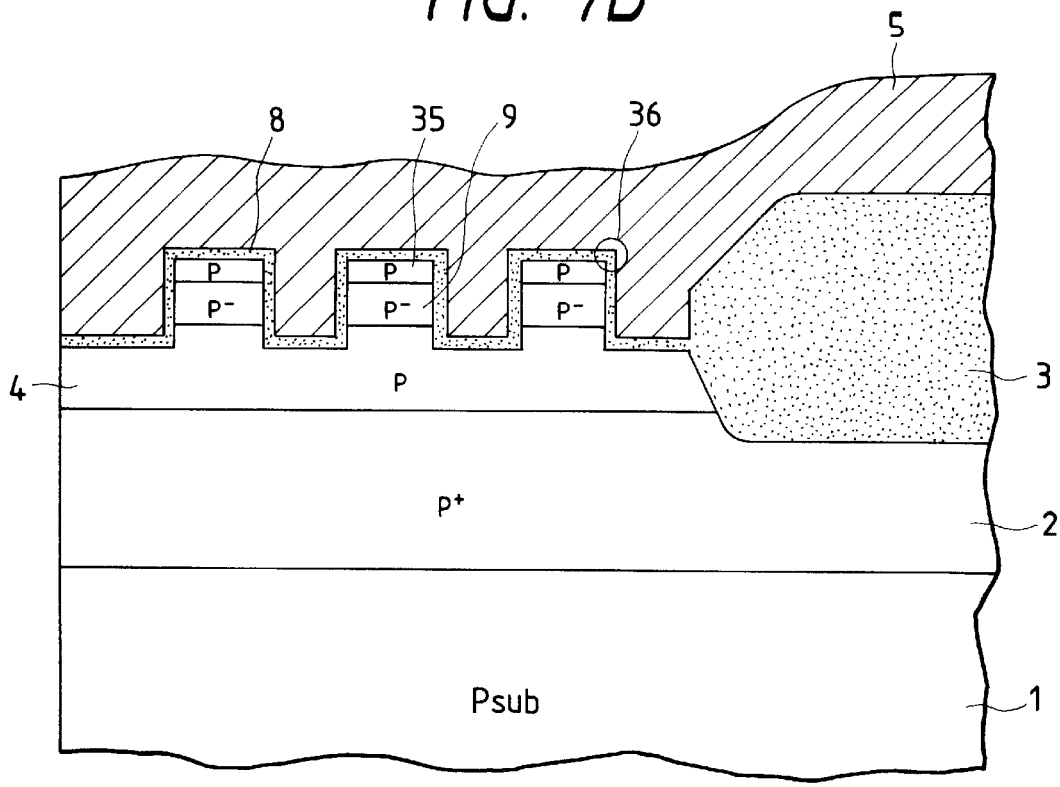
FIG. 7B is a diagrammatic cross sectional view taken along the line AA' in FIG. 7A.
Figure 7C:
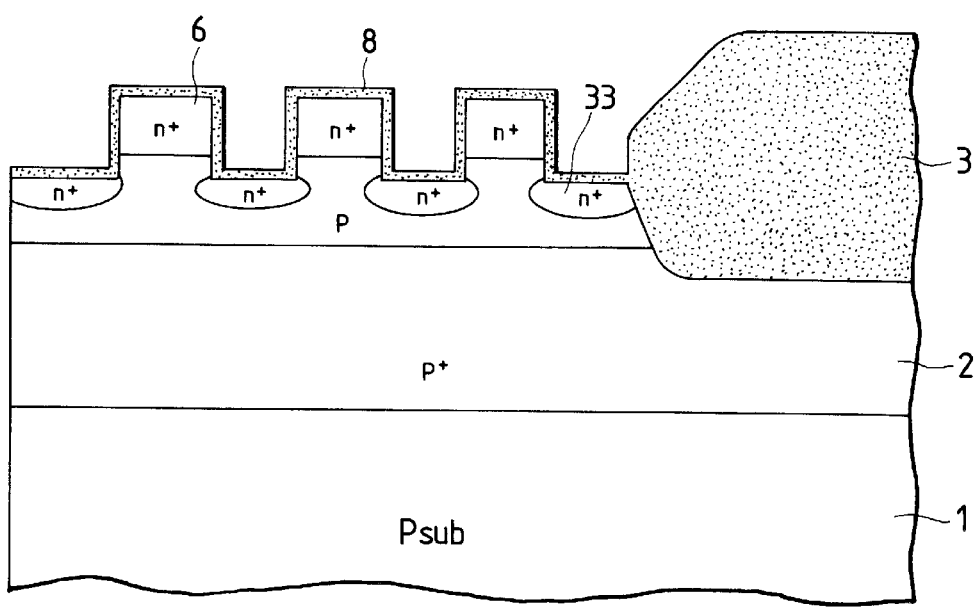
FIG. 7C is a diagrammatic cross sectional view taken along the line BB' in FIG. 7A.
Figure 7D:
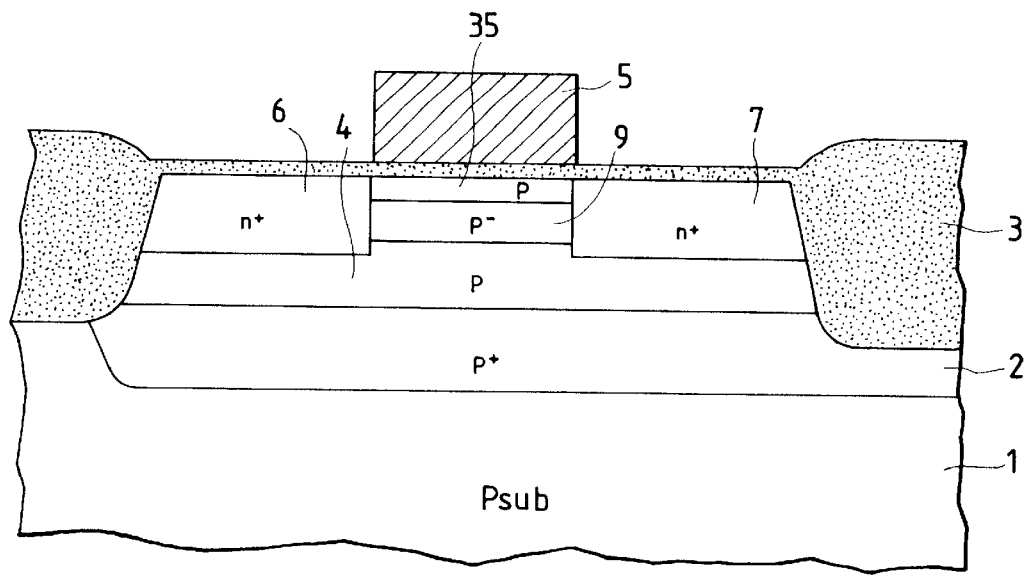
FIG. 7D is a diagrammatic cross sectional view taken along the line CC' in FIG. 7A.
Figure 8A:
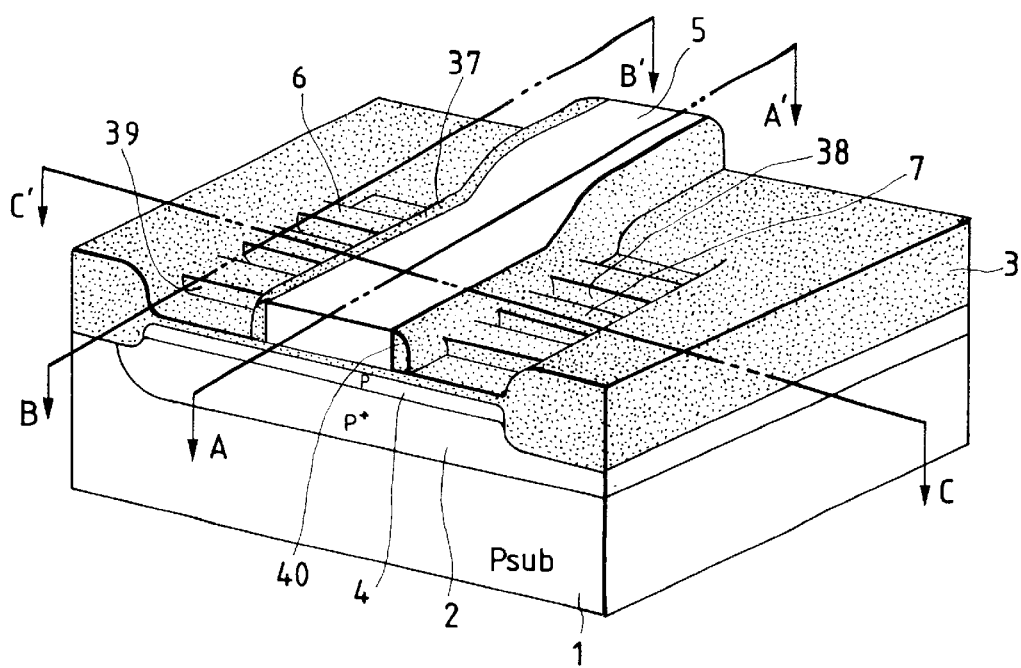
FIG. 8A is a diagrammatic perspective view showing an n type MOSFET according to the third embodiment of the invention.
Figure 8B:
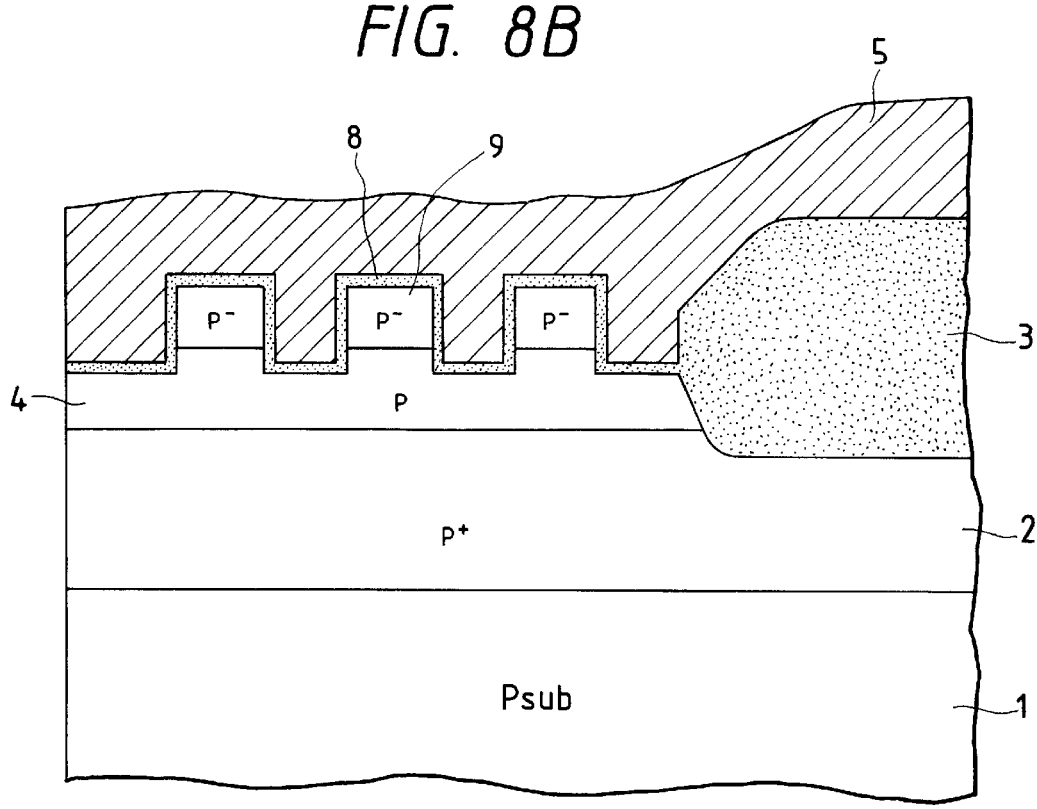
FIG. 8B is a diagrammatic cross sectional view taken along the line AA' in FIG. 8A.
Figure 8C:
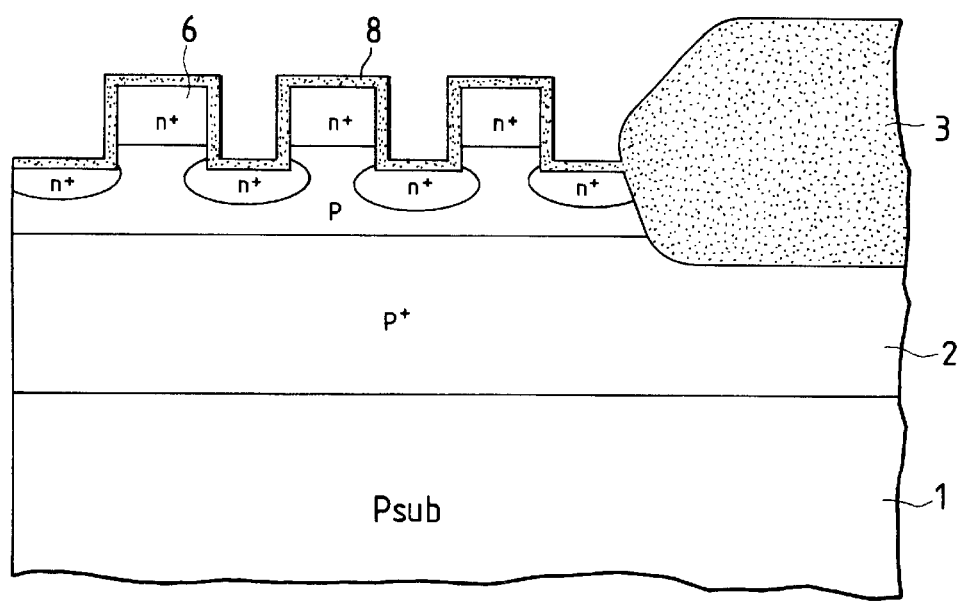
FIG. 8C is a diagrammatic cross sectional view taken along the line BB' in FIG. 8A.
Figure 8D:
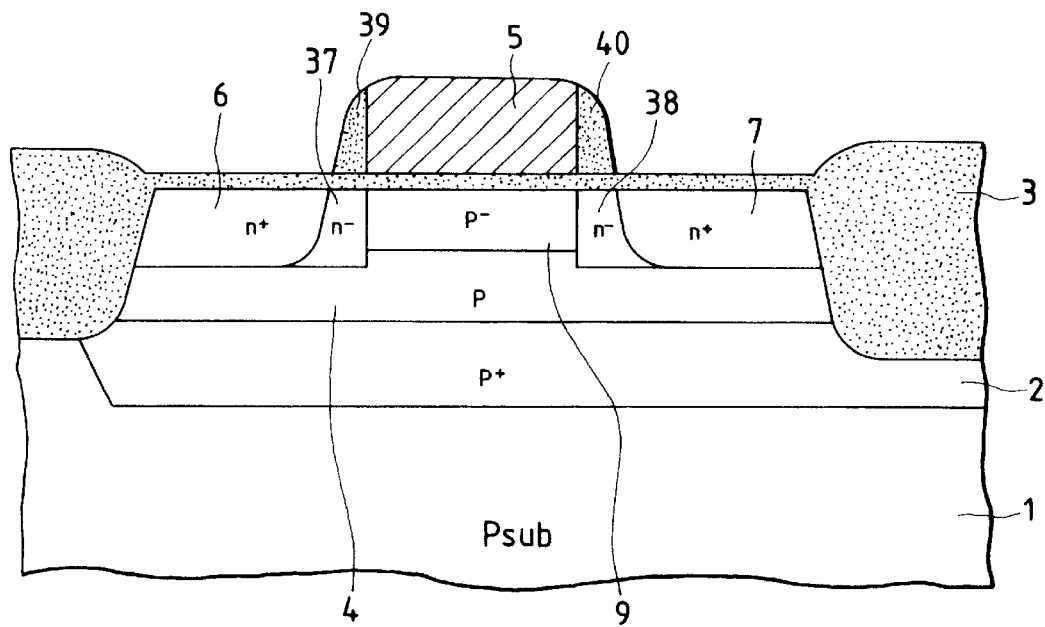
FIG. 8D is a diagrammatic cross sectional view taken along the line CC' in FIG. 8A.

As typically shown in FIGS. 7B and 7D, the second embodiment differs from the construction of the first embodiment with respect to a point that a p layer 35 having the same conductivity as that of the p⁻ layer 9 and an impurity concentration higher than that of the p⁻ layer is formed on the p⁻ layer 9 serving as the channel region.

The above structure can be formed by merely epitaxially growing the layers while changing the impurity concentration when the p well layer 4, p⁻ layer 9, and p layer 35 are formed. Such an epitaxial growth can be executed by steps similar to those in the first embodiment upon manufacturing.

The operation of the second embodiment will now be described. The impurity concentrations of the p well layer 4 and the p layer 35 are set to values such that no inversion layer is formed on the interface side with the upper gate insulative film 8 even when the gate voltage in the operation is set to the maximum value. Therefore, channels are formed in only the side wall portions of the p⁻ layer 9 and the gate insulative film 8. Thus, the above construction is equivalent to the construction comprising purely two opposite gates and the operation becomes stable.

A thickness of insulative film of the edge portion of Si is ordinarily thinner than the flat surface portion and the withstanding voltage decreases. However, according to the embodiment, as shown in an edge portion 36, an enough high withstanding voltage is obtained by an amount corresponding to the high concentration of the inside p layer. It is possible to use an insulative film having a thickness thinner than that in the first embodiment. Thus, high gm characteristics are derived.

In the construction of the second embodiment, although the p layer 35 has been formed in the upper portion of the channel region, an impurity concentration of the n⁺ layer is sufficiently larger than that of the p layer 35 because of the implantation of the n⁺ type conductive ions upon formation of the source and drain regions. Therefore, the source-drain portion is not influenced.

In the case of the second embodiment, the relations corresponding to the equation (9) in the first embodiment are given by $$d_1 + d_5 \leq X_{jn} < d_4 \quad (10)$$

when a film thickness of the p layer 35 assumes $d_5$ and a film thickness of the p⁻ layer 9 assumes $d_1$. $X_{jn}$ denotes a depth of the n⁺ layer and $d_4$ indicates a thickness of groove of the mesa in a manner similar to the first embodiment.

Third Embodiment

The third embodiment of the invention will now be described with reference to FIG. 8. In FIG. 8, the same parts and components as those shown in FIG. 1 are designated by the same reference numerals and their descriptions are omitted here. The third embodiment differs from the first embodiment with respect to a point that n⁻ layers 37 and 38 are formed at positions near the gate electrodes of the source-drain regions as shown at 37 and 38 in FIGS. 8A and 8D. The field concentration of the portion near the source and drain regions is reduced by the n⁻ layers and there is an advantage such that the deterioration of the characteristics by the hot carriers further decreases. The above structure is formed in the following manner. After the gate electrode was patterned, ions are implanted into the portions to form the n⁻ layers 37 and 38 by using the gate electrode as a mask. Then, a silicon oxide film is formed so as to cover the gate electrode by the CVD method. An anisotropical etching is executed to the silicon oxide film by the RIE method. Thus, silicon oxide films remain in the side wall portions of the gate electrode as shown at 39 and 40 in FIG. 8D. In the above shape, ions of the n⁺ conductivity type are again implanted and source and drain regions are formed until the same diffusion depth as the depth of the n⁻ layer. In the embodiment, although the n⁻ layers have been formed on both sides of the source and drain, it is also possible to use a structure such that the n⁻ layer is formed on only the drain side, thereby reducing the parasitic resistance of the source and improving the gm characteristics.

Fourth Embodiment

The fourth embodiment of the invention will now be described with reference to FIG. 9. In FIG. 9, the same parts and components as those in the first embodiment are designated by the same reference numerals and their descriptions are omitted.

Figure 9A:
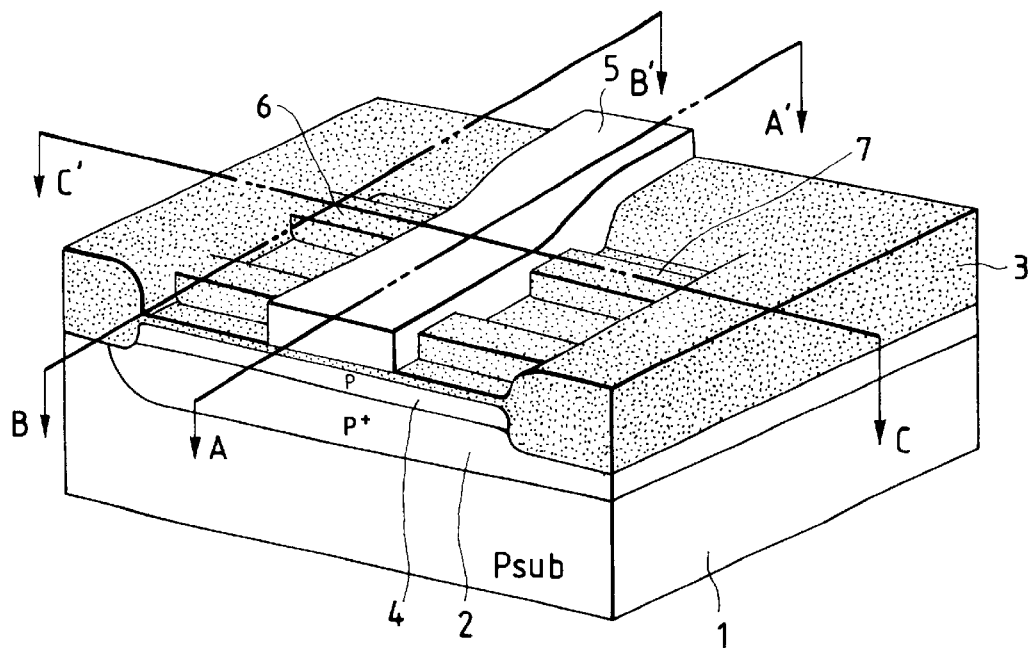
FIG. 9A is a diagrammatic perspective view showing an n type MOSFET according to the fourth embodiment of the invention.
Figure 9B:
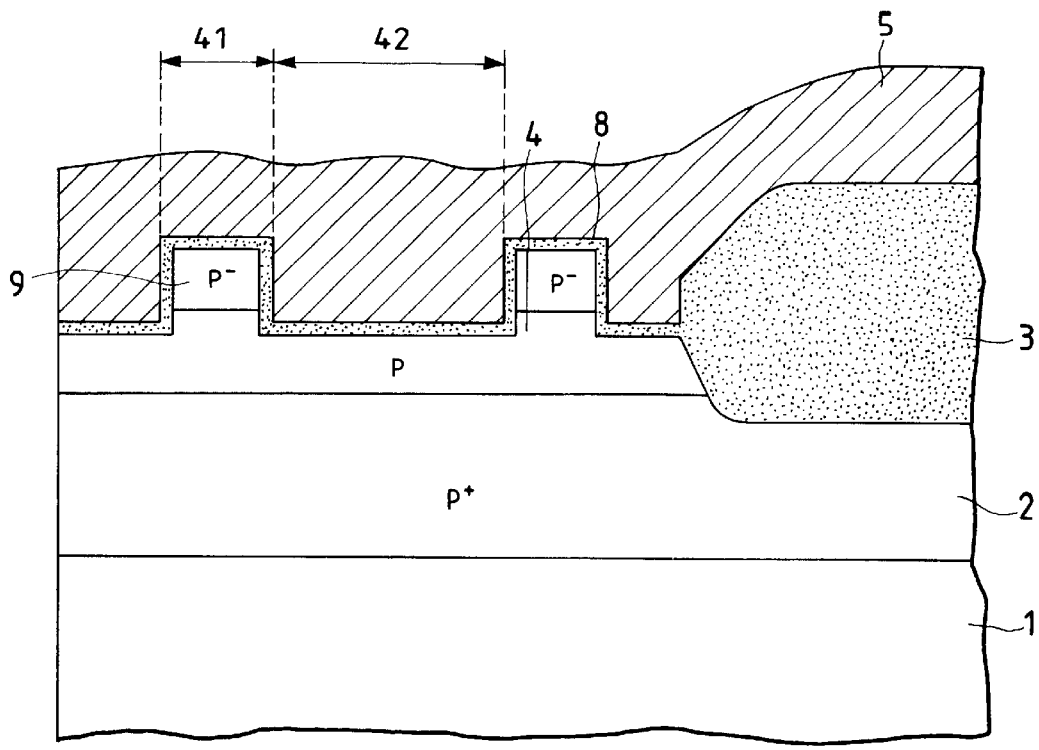
FIG. 9B is a diagrammatic cross sectional view taken along the line AA' in FIG. 9A.
Figure 9C:
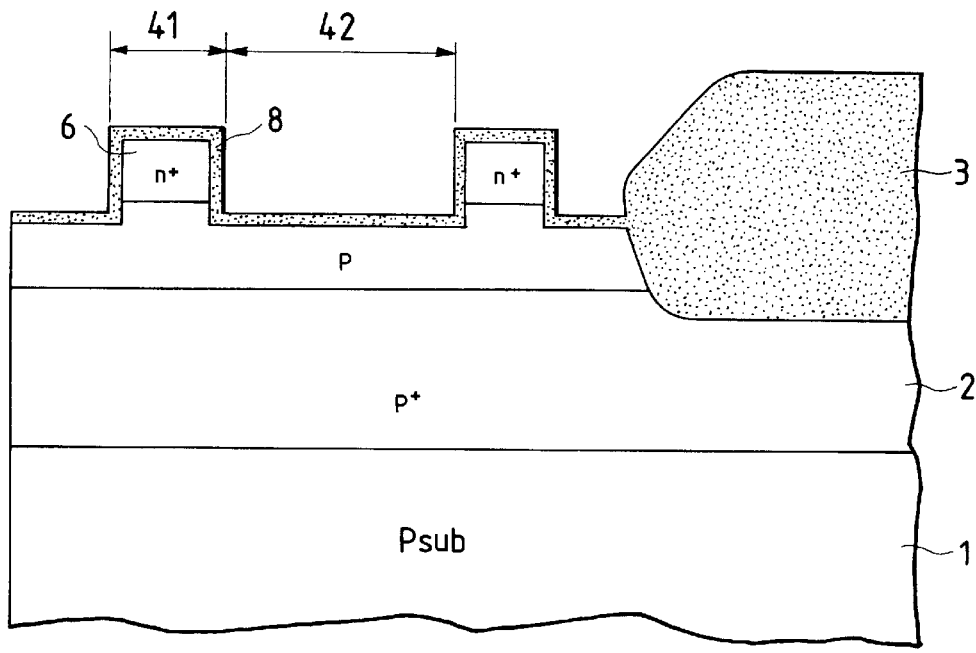
FIG. 9C is a diagrammatic cross sectional view taken along the line BB' in FIG. 9A.
Figure 9D:
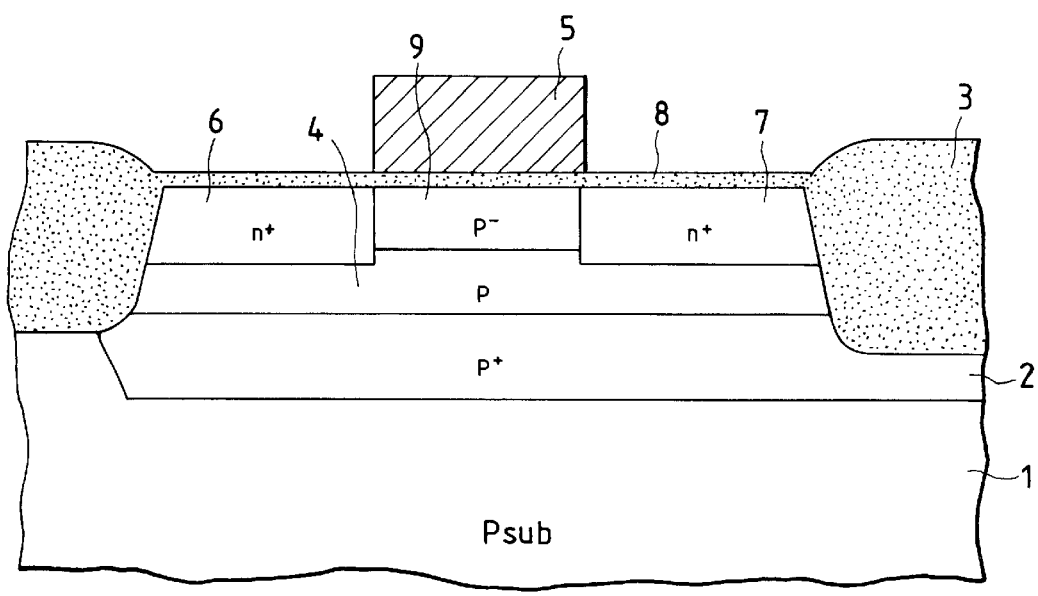
FIG. 9D is a diagrammatic cross sectional view taken along the line CC' in FIGS. 9A.
Figure 10:
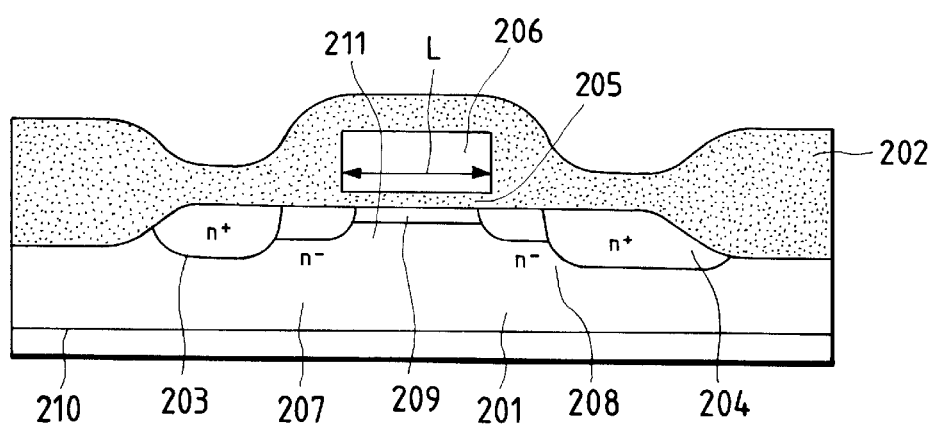
FIG. 10 is a diagrammatic cross sectional view showing a MOSFET having a conventional LDD structure.
Figure 11:
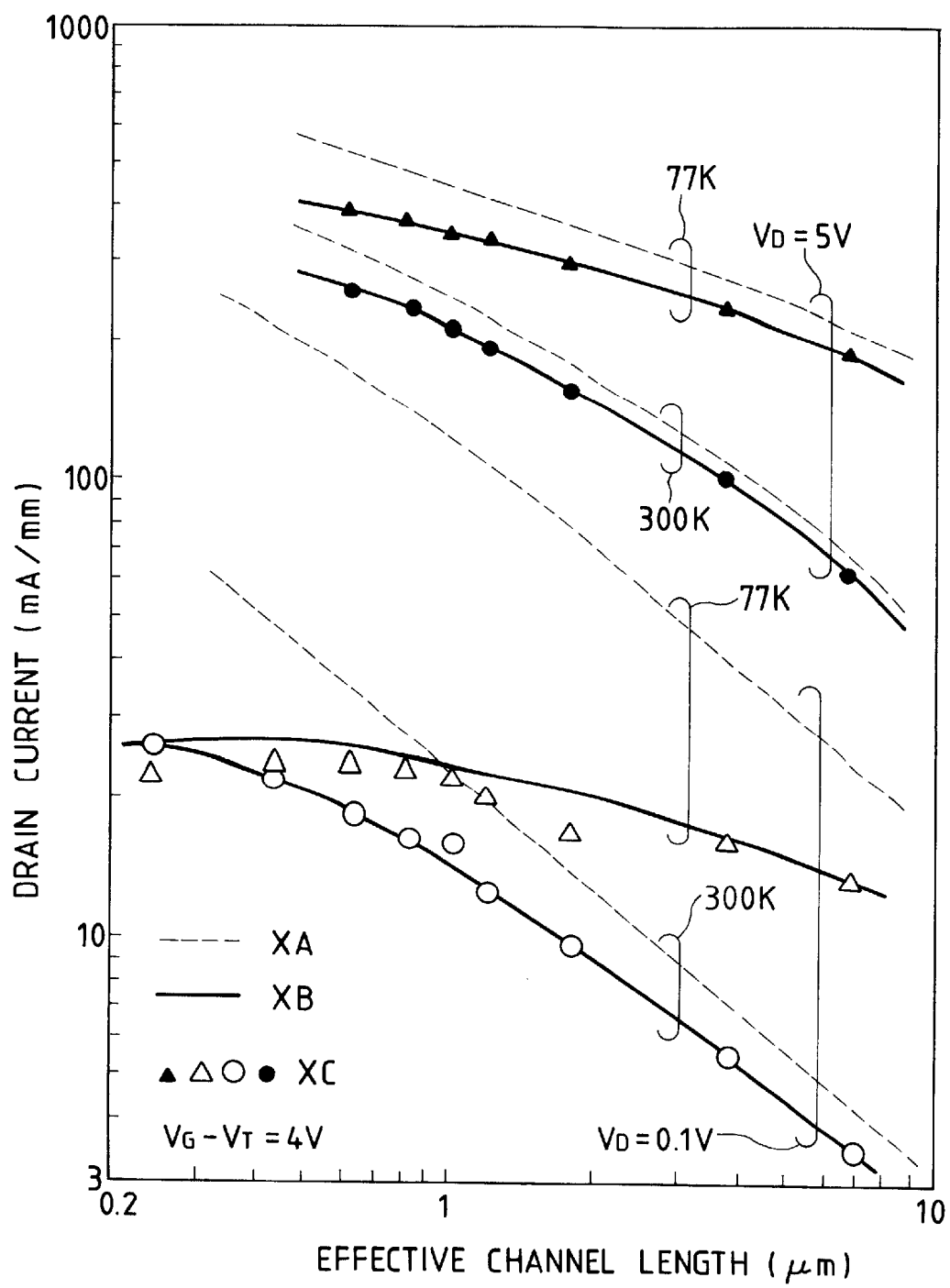
FIG. 11 is a graph showing an effective channel length dependency of a drain current of the MOSFET having the conventional LDD structure.

As typically shown in FIGS. 9B and 9C, the fourth embodiment differs from the first embodiment with respect to a point that a width of each MOSFET element, that is, a width 41 of the mesa structure differs from an interval 42 between the mesa structures. The above structure can be realized by using an electron beam direct drawing method or a convergent ion beam direct drawing method upon patterning. By using the structure of the fourth embodiment, the field oxide film 3 and the mesa structure portion do not come into contact with each other, and the mesa structures do not come into contact with each other due to a variation in manufacturing processes, so that the stable operation is derived.

Although all of the embodiments of the invention have been described with respect to the device comprising a plurality of MOSFET elements, it is also possible to use a device comprising a single mesa structure as an MOSFET element.

In the above described channel region of the semiconductor device according to the invention, a width ($d_3$) in the opposite portion direction of the channel region sandwiched by the opposite portions of the gate electrode and an impurity concentration of the semiconductor of the channel region are preferably determined as follows. That is, they are properly selected in a manner such that even when the gate voltage is OFF, depletion layers extending from the opposite portions are coupled and are depleted. Practically speaking, assuming that a width of channel region in the opposite portion direction of the gate electrode is set to $d_3$ and a width of depletion layer extending in the same direction is set to W, they are designed so as to satisfy the relation of $d_3 \leq W$. This is because the following advantage is expected. That is if the channel region between both of the opposite electrodes is formed as a depletion layer, even if the gate voltage rises until the level at which an inversion layer is formed, an electric field which is applied to the inside of the channel region is reduced and the characteristics of the device are improved.

In the case of SGT, since the channel is vertically arranged, there are the following problems.

First, a large variation occurs in the channel length L.

Figure 13A:
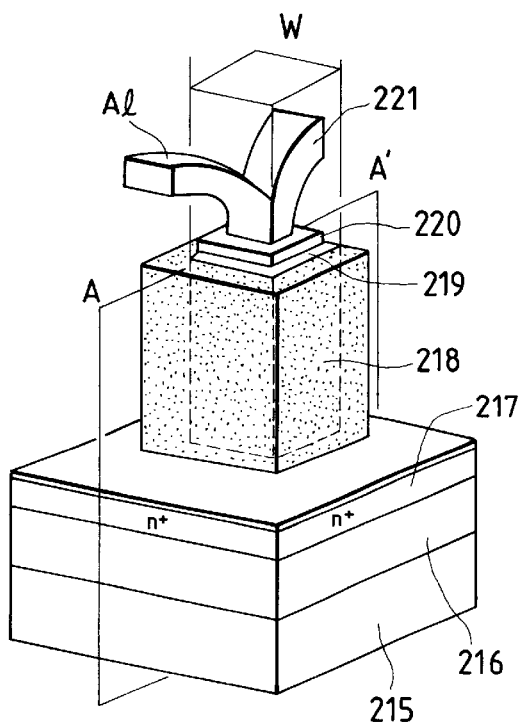
FIGS. 13A and 13B are diagrammatical views showing a conventional SGT (Surrounding Gate Transistor)
Figure 13B:
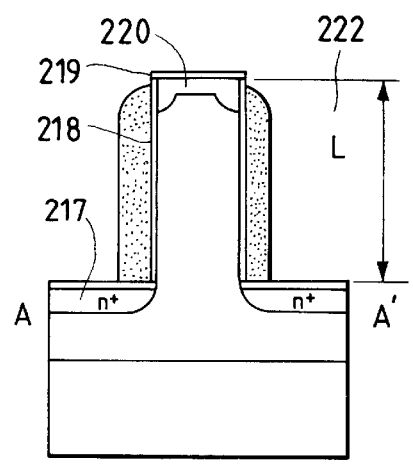

As shown in FIGS. 13A and 13B, particularly, as shown at 222, since the channel length of SGT is determined by an etching depth of Si, it is necessary that a variation in gate length at the level of the gate length of 0.1 μm is restricted within 100 Å. According to the present dry etching method, it is extremely difficult to keep the variation in gate length to a value within such a range in the wafer surface or between the wafers.

Figure 14A:
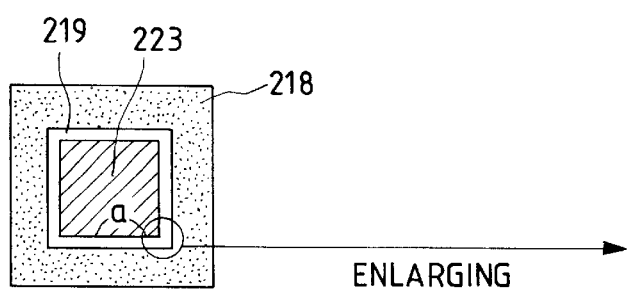
FIGS. 14A and 14B are a diagrammatic plan view of a channel portion of the SGT in FIG. 13 and a partial enlarged diagram thereof.
Figure 14B:
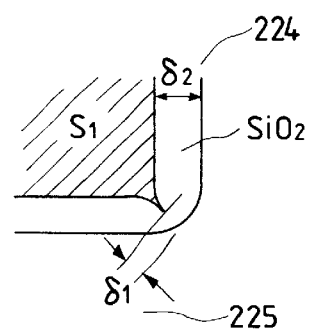

Second, there is no degree of freedom in designing of the gate width W. FIG. 14A shows a plan view of the SGT and FIG. 14B shows a partial enlarged diagram of the SGT.

The inherent SGT has a square structure as shown in FIG. 14A. In this case, assuming that a length of one side of the square is set to a as shown at 223 in FIG. 14A, the gate width W is $$W=4a \qquad (1)$$

To change the gate width W in accordance with the circuit characteristics, the length of one side of the square must be changed. In this case, various characteristics change due to an influence by a depletion layer extending just under the gate oxide film. Such an example is shown in FIGS. 15A and 15B. Therefore, the gate width W is limited to a value in a certain range and there is no degree of freedom in designing.

Third, there is a problem of a decrease in withstanding voltage of an oxide film of the edge portion of Si.

FIG. 14B shows a method of changing the oxide film thickness of the Si edge portion. As shown at 224 in FIG. 14B, assuming that an oxide film thickness of the Si flat region is set to $\delta_2$ and a film thickness of a portion near the edge is set to $\delta_1$, $$\delta_1 < \delta_2 \qquad (2)$$

There is a tendency such that the shape of Si of the edge portion becomes sharp, so that the withstanding pressure of the portion near the edge deteriorates.

Fourth, it is difficult to form a leading electrode of the drain portion. As shown at 221 in FIG. 13, the leading electrode of the drain portion needs to exist over the drain portion 220 and to be insulated from the gate electrode formed on the side wall. In the case where the width a between the two opposite gate electrodes is set to a value of a few μm level, such a structure can be realized. However, as will be practically explained hereinlater with respect to a structure of the invention, an interval between the two opposite gate electrodes needs to be set to a narrow interval of a few 1000 Å level or less in order to improve the characteristics. However, at such a level, it is very difficult to form the leading electrode in the vertical type transistor.

In the SOI type MOSFET, to form an Si layer, double Kipp's layers of $SiO_2$ and $Si_3N_4$ are formed on the surface of a polycrystal having a thickness of 0.5 μm and a recrystallization is executed by CW-A of an output of 4 to 5 W and an ion laser. As a method of forming an Si crystalline layer onto the $SiO_2$ layer, a few methods have been tried in addition to such a laser recrystallizing method. However, an adequate crystal is not obtained at present. In the laser recrystallizing method, it is necessary to scan the whole surface of the wafer by a laser beam. However, such a method is not practical because a throughput is poor. As mentioned above, the problem of the SOI itself remains.

According to the structure of the invention, a pair of two opposite gate electrode are used although the SGT needs two pairs each comprising two opposite gate electrodes. On the other hand, in the case of the SGT, the gate portion and the source portion are vertically provided. According to the structure of the invention, the gate portion and the source portion are provided at the front and rear positions in the lateral direction of the two gate electrodes which face.

By using the above structure, the electrodes of the source and drain can be easily formed on the same flat surface in a manner similar to the conventional MOSFET. On the other hand, since the channel length is determined by the width between the gate electrodes in a manner similar to the conventional MOSFET, the working accuracy of the channel length is high. The patterning of a semiconductor to form a structure of two opposite gate electrodes which are laterally arranged can be also performed by a lithography technique without a mask, so that the above structure is suitable to fine. Accordingly, the interval between the two gate electrodes can be narrowed and the punchthrough can be prevented without raising the impurity concentration, so that even if a device with a higher integration degree is formed, high gm characteristics can be derived.

Therefore, according to the semiconductor devices of the embodiments, the high mobility, high gm characteristics, good Stacta characteristics, and good switching characteristics can be realized. A number of semiconductor devices such as MOSFETs or the like having a fine structure which have the above excellent characteristics and have no variation can be obtained by the simple manufacturing processes.

We claim:

1. An insulated gate transistor comprising:

source regions;

drain regions;

channel regions provided between said source and drain regions;

a gate electrode, said gate electrode having at least two opposing portions which face each other; and a gate insulative film provided between said channel regions and said gate electrode, said gate insulative film also having at least two opposing portions which face each other, wherein said transistor has a semiconductor region which is provided so as to be in contact with said channel regions, said semiconductor region has the same conductivity type as said channel regions and has an impurity concentration higher than that of said channel regions, and said semiconductor region is maintained at a predetermined potential during operation of the transistor, wherein at least a portion of said semiconductor region is disposed between said opposing portions of said gate electrode and between said opposing portions of said gate insulative film, and wherein the portion of semiconductor region extends between the opposing portions of said gate insulative film and is in contact with each of the opposing portions of said rate insulative film.

2. A semiconductor device comprising a plurality of transistors provided on a common substrate, each transistor comprising:

a source region, a drain region, a channel region provided between said source and drain regions, a gate electrode having at least two opposing portions facing each other; and a gate insulative film provided between said channel region and said gate electrode, said gate insulative film also having at least two opposing portions facing each other, wherein each transistor has a semiconductor region which is provided so as to be in contact with said channel region, said semiconductor region has the same conductivity type as said channel region and has an impurity concentration higher than that of said channel region, and said semiconductor region is maintained at a predetermined potential during operation of the transistor, wherein at least a portion of said semiconductor region is disposed between said opposing portions of said gate electrode and between said opposing portions of said gate insulative film, and wherein the portion of said semiconductor region extends between the opposing portions of said gate insulative film and is in contact with each of the opposing portions of said gate insulative film.

3. An insulated gate transistor comprising:

main electrode regions of a first conductivity type semiconductor;

a channel region of a second conductivity type semiconductor, different from the first conductivity type, provided between said main electrode regions;

a gate electrode having portions opposing each other;

a gate insulative film provided between said gate electrode and said channel region said gate insulative film also having portions opposing each other; and a semiconductor region having an impurity concentration higher than that of said channel region provided adjacent to said channel region, said semiconductor region being maintained at a predetermined potential during operation of the transistor, wherein at least a portion of said semiconductor region is disposed between said opposing portions of said gate electrode and between said opposing portions of said gate insulative film, and wherein the portion of said semiconductor region extends between the opposing portions of said gate insulative film and is in contact with each of the opposing portions of said gate insulative film.

4. A semiconductor device according to any one of claims 1 to 3, wherein said transistor is surrounded by an insulating film having a thickness larger than the thickness of said gate insulative film.

5. A semiconductor device comprising:

a transistor having a semiconductor island region including source and drain regions and a channel region provided therebetween, and a gate electrode having opposing sections sandwiching said channel region via a gate insulating film, said transistor being provided on a semiconductor layer on a semiconductor body of a conductivity type opposite to that of said source and drain regions, with said channel region being adjacent to said semiconductor layer, said semiconductor layer having an impurity concentration higher than that of said channel region and lower than that of said semiconductor body and at least a part of said semiconductor layer being sandwiched between said two opposing sections of said gate electrode.

6. A semiconductor device according to claim 5, wherein a plurality of said island regions are provided on said semiconductor layer.

7. A semiconductor device according to claim 5, wherein between said source and drain regions and said semiconductor island region a pn junction is formed.

8. A semiconductor device comprising:

a transistor having a semiconductor island region including source and drain regions and a channel region provided therebetween, and a gate electrode having opposing sections sandwhiching said channel region via a gate insulating film, said transistor being provided on a semiconductor layer on a semiconductor body of a conductivity type opposite to that of said source and drain regions, with said channel region being adjaent to said semiconductor layer, said semiconductor layer having an impurity concentration higher than that of said channel region and lower than that of said semiconductor body and at least a part of said semiconductor layer being sandwhiched between said two opposing sections of said gate electrode, wherein a region of high impurity concentration and the same conductivity type of said channel region is provided at an upper section of said channel region of said island region.

9. A semiconductor device comprising:

a transistor having a semiconductor island region including source and drain regions and a channel region provided therebetween, and a gate electrode having opposing sections sandwiching said channel region via a gate insulating film, said transistor being provided on a semiconductor layer on a semiconductor body of a conductivity type opposite to that of said source and drain regions, with said channel region being adjacent to said semiconductor layer, said semiconductor layer having an impurity concentration higher than that of saidchannel region and lower than that of said semiconductor body and at least a part of said semiconductor layer being sandwiched between said two opposing sections of said gate electrode, wherein said semiconductor body is provided on a substrate having an impurity concentrationlower than that of said semiconductor body.

10. A semiconductor device according to claim 5, wherein an insulating film is provided on at least a portion of said semiconductor body and surrounds said semiconductor layer, said insulating film being thicker than said gate insulating film.

* * * * *

UNITED STATES PATENT AND TRADEMARK OFFICE
CERTIFICATE OF CORRECTION

PATENT NO. : 6,242,783 B1
DATED : June 5, 2001
INVENTOR(S) : Tadahiro Ohmi et al.

It is certified that error appears in the above-identified patent and that said Letters Patent is hereby corrected as shown below:

Title page,
Item [56] References Cited - FOREIGN PATENT DOCUMENTS
"64-82672 3/1982" should read -- 64-82672 3/1989 --.

Column 1,
Line 20, "cross sectional" should read -- cross-sectional -- and "a" (second occurrence) should read -- an --.

Column 2,
Line 5, "an" should read -- the --; and
Line 7, "the" (1st occurrence) should be deleted.

Column 4,
Line 10, "cross sectional" should read -- cross-sectional --;
Line 12, "cross sectional" should read -- cross-sectional --;
Line 14, "cross sectional" should read -- cross-sectional --;
Line 34, "to" should be deleted;
Line 40, "cross sectional" should read -- cross-sectional --;
Line 47, "cross sectional" should read -- cross-sectional --;
Line 49, "cross sectional" should read -- cross-sectional --;
Line 51, "cross sectional" should read -- cross-sectional --;
Line 56, "cross sectional" should read -- cross-sectional --;
Line 58, "cross sectional" should read -- cross-sectional --;
Line 61, "cross sectional" should read -- cross-sectional --; and
Line 66, "cross sectional" should read -- cross-sectional --;

Column 5,
Line 1, "cross sectional" should read -- cross-sectional --;
Line 3, "cross sectional" should read -- cross-sectional --;
Line 5, "cross sectional" should read -- cross-sectional --;
Line 19, "cross sectional" should read -- cross-sectional --;
Line 65, "dope" should read -- doped --.

Column 6,
Line 4, "cross sectional" should read -- cross-sectional --;
Line 47, "cross" should read -- cross- --;
Line 49, "cross sectional" should read -- cross-sectional --;
Line 50, "cross sectional" should read -- cross-sectional --;
Line 54, "cross sectional" should read -- cross-sectional --;

UNITED STATES PATENT AND TRADEMARK OFFICE
CERTIFICATE OF CORRECTION

PATENT NO. : 6,242,783 B1
DATED : June 5, 2001
INVENTOR(S) : Tadahiro Ohmi et al.

It is certified that error appears in the above-identified patent and that said Letters Patent is hereby corrected as shown below:

<u>Column 6, contd.</u>
Line 56, "cross sectional" should read -- cross-sectional --;
Line 61, "cross sectional" should read -- cross-sectional --;
Line 64, "cross sectional" should read -- cross-sectional --; and
Line 66, "cross sectional" should read -- cross-sectional --;

<u>Column 9,</u>
Line 16, "cross sectional" should read -- cross-sectional --;
Line 18, "cross sectional" should read -- cross-sectional --; and
Line 66, "(cross sectional" should read -- (cross-sectional --.

<u>Column 17,</u>
Line 5, "sandwhiched" should read -- sandwiched --.

<u>Column 18,</u>
Line 4, "saidchannel" should read -- said channel --; and
Line 18, "concentrationlower" should read -- concentration lower --.

Signed and Sealed this

Twenty-sixth Day of February, 2002

Attest:

JAMES E. ROGAN
*Attesting Officer*   *Director of the United States Patent and Trademark Office*